US012787469B2

(12) United States Patent
Ho et al.

(10) Patent No.: US 12,787,469 B2
(45) Date of Patent: Nov. 3, 2026

(54) IMAGE SENSORS AND METHODS OF MANUFACTURING THEM

(71) Applicant: Taiwan Semiconductor Manufacturing Company, Ltd., Hsinchu (TW)

(72) Inventors: Cheng Ying Ho, Minxiong Township (TW); Kai-Chun Hsu, Yonghe City (TW); Wen-De Wang, Minsyong Township (TW); Cheng-Yu Hsieh, Tainan City (TW); Jen-Cheng Liu, Hsin-Chu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 379 days.

(21) Appl. No.: 18/487,223

(22) Filed: Oct. 16, 2023

(65) Prior Publication Data

US 2025/0126914 A1 Apr. 17, 2025

(51) Int. Cl.
*H10F 39/00* (2025.01)

(52) U.S. Cl.
CPC ....... *H10F 39/8063* (2025.01); *H10F 39/024* (2025.01); *H10F 39/8053* (2025.01); *H10F 39/8057* (2025.01); *H10F 39/811* (2025.01)

(58) Field of Classification Search
CPC ............. H10F 39/8063; H10F 39/8057; H10F 39/014; H10F 39/024
See application file for complete search history.

(56) References Cited

U.S. PATENT DOCUMENTS

| | | | | |
|---|---|---|---|---|
| 8,377,733 | B2 | 2/2013 | Huang et al. | |
| 11,211,419 | B2 | 12/2021 | Wu et al. | |
| 2013/0270663 | A1 | 10/2013 | Lin et al. | |
| 2016/0172399 | A1 | 6/2016 | Nakata | |
| 2016/0343753 | A1 | 11/2016 | Asatsuma | |
| 2019/0035838 | A1 | 1/2019 | Byun | |
| 2019/0035839 | A1 | 1/2019 | Byun | |
| 2021/0377481 | A1 | 12/2021 | Hsieh et al. | |
| 2023/0369370 | A1* | 11/2023 | Chen | H10F 39/804 |
| 2024/0120358 | A1* | 4/2024 | Banerjee | G02B 1/118 |

FOREIGN PATENT DOCUMENTS

| | | | | |
|---|---|---|---|---|
| KR | 20130100661 A | * | 9/2013 | H10F 39/18 |

* cited by examiner

*Primary Examiner* — Edward Chin
(74) *Attorney, Agent, or Firm* — Eschweiler & Potashnik, LLC

(57) ABSTRACT

An image sensor includes photosensitive areas in a first array within a semiconductor substrate. Microlens are disposed over the semiconductor substrate in a second array. Metal shields are disposed between a subset of the microlenses and corresponding photosensitive areas. The metal half-shields have dimensions and positions that provide half-shielding that enables half-shield phase detection autofocus. An antireflective coating is disposed over the metal half-shields. The metal half-shields and the antireflective coating may be in a composite grid that provides lateral separation between color filters. Alternatively, metal half-shields and the antireflective coating may be in below a layer that includes color filters. The antireflective coating includes a quarter-wave layer.

20 Claims, 25 Drawing Sheets

IMAGE SENSORS AND METHODS OF MANUFACTURING THEM

BACKGROUND

Many modern day electronic devices (e.g., digital cameras, optical imaging devices, etc.) comprise image sensors. An image sensor includes an array of pixel sensors, which are transducers for converting light into digital data. Some types of pixel sensors include charge-coupled device (CCD) image sensors and complementary metal-oxide-semiconductor (CMOS) image sensors. Compared to CCD pixel sensors, CMOS pixel sensors are favored due to low power consumption, small size, fast data processing, a direct output of data, and low manufacturing cost. Some CIS image sensors provide autofocus. One type of autofocus is contrast detection autofocus. Contrast detection autofocus works by analyzing the contrast in the image and adjusting the focus until the highest contrast is achieved. While this method can be accurate, it is relatively slow. Phase detection autofocus (PDAF) is faster. PDAF uses dedicated pixels to detect and measure phase differences between light rays coming from different parts of a scene. Using the phase differences, a camera can quickly determine the distance of a subject and adjust the focus accordingly.

BRIEF DESCRIPTION OF THE DRAWINGS

Aspects of the present disclosure are best understood from the following detailed description when read with the accompanying figures. In accordance with standard industry practice, features are not drawn to scale. Moreover, the dimensions of various features within individual drawings may be arbitrarily increased or reduced relative to one-another to facilitate illustration or provide emphasis.

DETAILED DESCRIPTION

Figure 1:
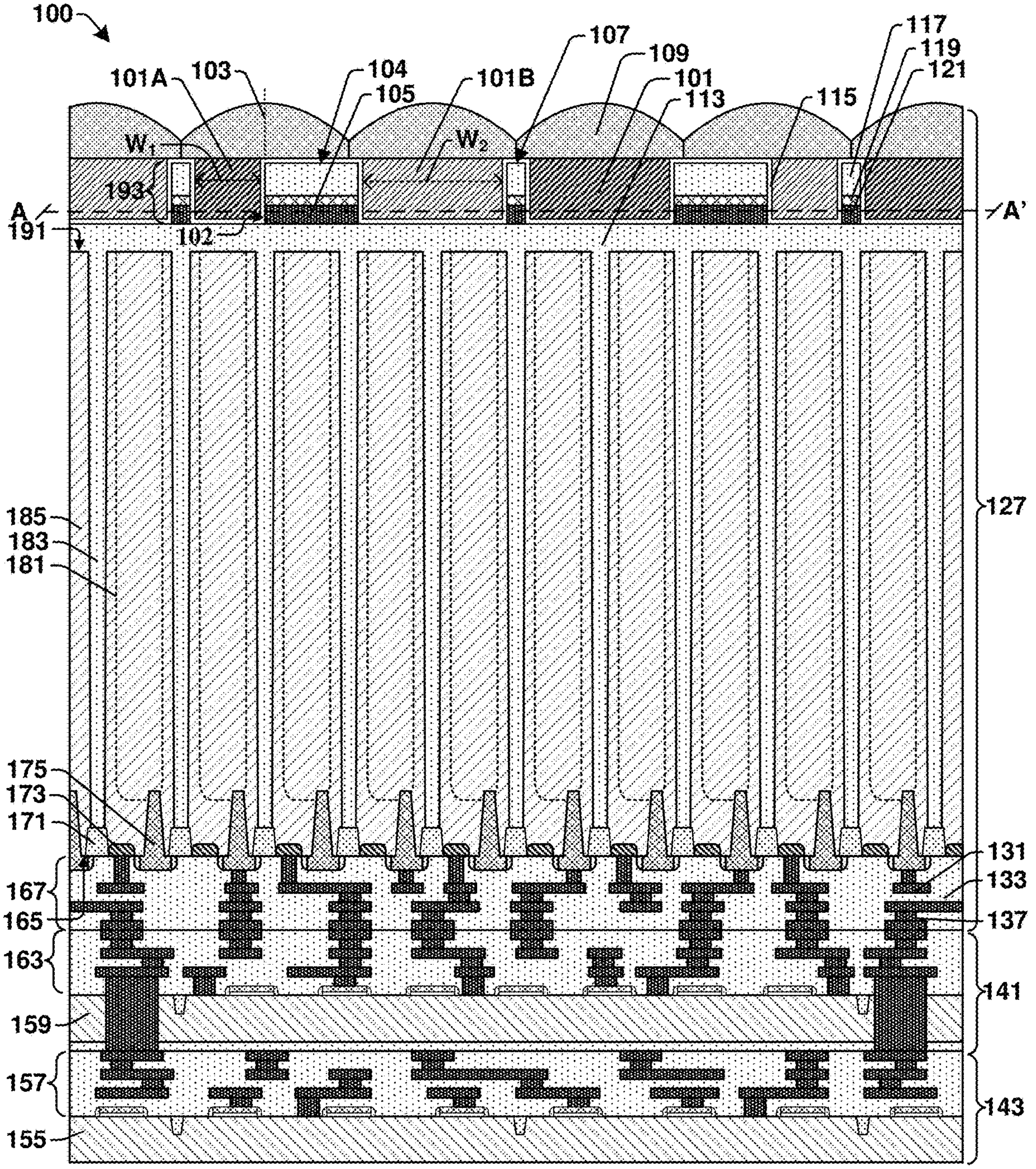
FIG. 1 illustrates a cross-sectional view of an image sensor according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

Spatially relative terms, such as “beneath,” “below,” “lower,” “above,” “upper”, and the like, may be used herein to describe one element or feature’s relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly. Terms “first”, “second”, “third”, “fourth”, and the like are merely generic identifiers and, as such, may be interchanged in various embodiments. For example, while an element (e.g., an opening) may be referred to as a “first” element in some embodiments, the element may be referred to as a “second” element in other embodiments.

One form of PDAF uses a quad pixel arrangement. In the quad pixel arrangement, four photodetector pixels are arranged in a 2×2 grid under each microlens. Two diagonally opposite pixels in the grid may be used for phase detection. The other two pixels may be active for image capture. The quad pixel arrangement provides good phase detection autofocus under low light conditions. Another form of PDAF is half-shield PDAF. Half-shield PDAF uses metal half-shields to mask half the area under a select group of mircolenses. Some of the microlenses are masked on one side (the left side) and the other on an opposite side (the right side). Data from under the microlenses shielded on the left side is compared to data from under microlenses shielded on the right side to provide phase detection. The half-shield PDAF performs better at higher light levels.

Quad pixel PDAF and half-shield PDAF may be combined, however, it has been found that reflections from the metal half-shields may cause crosstalk that affects the pixels that are active for image sensing. In accordance with the present disclosure, an antireflective coating is provided over the metal half-shields. The antireflective coating reduces or eliminates this source of crosstalk and is particularly useful for an image sensing device in which quad pixel PDAF and half-shield PDAF are combined.

Some aspects of the present disclosure relate to an image sensor comprising photodetectors that include photosensitive areas in a first array within a semiconductor substrate. Microlenses are disposed over the semiconductor substrate in a second array. Metal half-shields are disposed between a subset of the microlenses and photosensitive areas that correspond to the microlenses. The metal half-shields have dimensions and positions that enables half-shield PDAF. An antireflective coating is disposed over the metal half-shields.

In some embodiments, the metal half-shields are incorporated into a back side metal grid that includes segments that correspond to boundaries between adjacent photodetector pixels. In some embodiments, the back side metal grid and the antireflective coating are parts of a composite grid that provides lateral separation between color filters. In some embodiments, the back side metal grid and the antireflective coating are below a layer that includes color filters. Placing the metal grid and the antireflective coating close to the photodetector pixels reduces crosstalk. In these embodiments, the footprint of the antireflective coating is limited to the footprint of the back side metal grid. Limiting the area of the antireflective coating to the area of the back side metal grid improves quantum efficiency.

In some embodiments, the antireflective coating prevents reflections through destructive interference of incident light. Destructive interference is greatest when a layer of material has a thickness that is one quarter the wavelength of the incident light. In some embodiments, the antireflective coatings comprise a layer having a quarter wavelength thickness for a wavelength of visible light. In some embodiments, the antireflective coatings comprise a layer having a quarter wavelength thickness for a wavelength of green light. Green light is at the center of the visible light spectrum. A layer having a quarter wavelength thickness is referred to as a quarter-wave layer.

In some embodiments, the antireflective coatings comprise a first layer having quarter wavelength thickness for a first wavelength of visible light and a second layer having quarter wavelength thickness for a second wavelength of visible light. In some embodiments, the shorter wavelength quarter-wave layer is above the longer wavelength quarter-wave layer. Stacking two quarter-wave layers in this manner may increase the effectiveness with which reflections are suppressed. In some embodiments, a quarter-wave layer is in direct contact with the half-shielding. Placing the quarter-wave layer closer to the half-shielding may improve the suppression of reflections.

In some embodiments, the quarter-wave layer is a dielectric such as silicon oxynitride ($SiO_xN_y$), silicon nitride (SiN), or the like. Silicon oxynitride has excellent optical properties and has a refractive index that can be tuned by varying the composition. In some embodiments, the quarter-wave layer is a metal compound. Metal compounds may provide particularly good adhesion to a metal that provides the half-shielding. In some embodiments, the metal compound is an oxide. Metal oxides such as tantalum oxide (TaO) and have good optical properties and process compatibility. Metal nitrides such as titanium nitride (TiN) and are particularly compatible with the type of metal used for half-shielding.

In some embodiments, some of the photodetectors are active pixels and others are PDAF pixels. Active pixels are coupled to an imaging circuit that construct images from data provided by the active pixels. PDAF pixels are coupled to a PDAF circuit that determines phase differences from the PDAF pixel data. The phase differences may relate to difference between "A" pixels (right side pixels) and "B" pixels (left side pixels) in a region of interest (ROI).

In some embodiments, the image sensor uses back side illumination. An image sensor configured for back side illumination can have a metal interconnect on the front side without the metal interconnect blocking any of the incident light.

FIG. 1 illustrates a cross-sectional view of an image sensor 100 according to some embodiments. The image sensor 100 is an integrated circuit (IC) device and may be 3D-IC including a first chip 127, a second chip 141, and a third chip 143 stacked, bonded, and interconnected together. The first chip 127 includes a semiconductor body 185 and a metal interconnect structure 167. The second chip 141 includes a second semiconductor substrate 159 and a second metal interconnect structure 163. The third chip 143 includes a third semiconductor substrate 155 and a third metal interconnect structure 157.

An array of photodiodes 181 is disposed within the semiconductor body 185. A deep trench isolation (DTI) structure 183 provides isolation between photodiodes 181 that are adjacent within the array. The isolation structure may be in the form of a grid having segments between adjacent photodiodes. The photodiodes 181 are photosensitive elements of photodetector pixels. The photodetector pixels may include transfer gates 175 and floating diffusion regions 173 on a front side 165 of the semiconductor body 185. Additional in pixel circuitry may include, for example, a reset gate transistor, a source follower transistor, a select gate transistor, and the like. This additional in pixel circuitry may be disposed on the second semiconductor substrate 159. Additional circuitry which may be application-specific may be disposed on the third semiconductor substrate 155.

An array of microlenses 109 is disposed over a back side 191 of the semiconductor body 185. In the image sensor 100, each of the microlenses 109 has a footprint that corresponds to four of the photodiodes 181 which are a 2×2 grid arrangement and is configured to focus incident radiation on those four photodiodes 181. In an alternative embodiment, each of the microlenses 109 corresponds to only one photodiode 181. An array of color filters 101 is disposed between the array of microlenses 109 and the photodiodes 181. There is one color filter 101 for each microlens 109. In some embodiments, the color filters 101 are in a Bayer pattern.

A composite grid 193 over the back side 191 includes a metal layer 121, an antireflective coating 119, and a dielectric layer 117. The composite grid 193 includes segments 104 and segments 107 that are disposed between and separate adjacent color filters 101. The metal layer 121 provides a back side metal grid. Segments 107 make up most of the composite grid 193. The segments 107 are comparatively narrow and are symmetrically arranged below junctures of the microlenses 109. The composite grid 193 also includes segments 104, which are like the segments 107 but are wider on one side so that the metal layer 121 in the segments 107 provides metal half-shields 105.

A color filter 101A on one side of a segment 104 has a width $W_1$. A color filter 101B on an opposite side of the segment 104 has a width $W_2$, which is smaller. The color filter 101B is centered below its corresponding microlens 109. The color filter 101A is offset to one side of its corresponding microlens 109. In some embodiments, the width $W_1$ is from about 25% to about 75% of the width $W_2$. The width $W_1$ may be about half the width $W_2$ so that an edge 102 of the metal half-shields 105 is approximately aligned with the center 103 of the half-shielded microlens 109.

Figure 2:
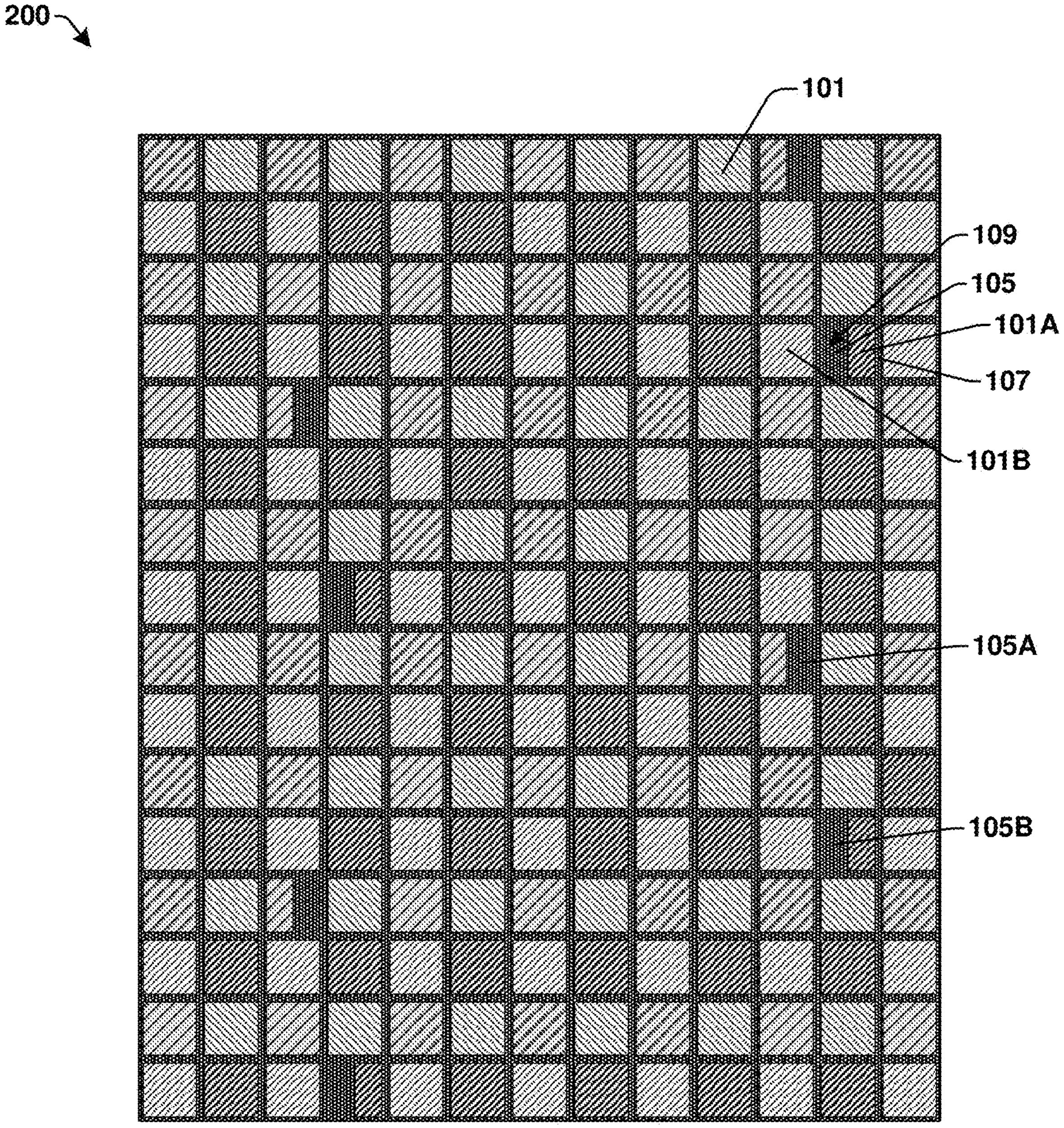
FIG. 2 illustrates a plan view of the image sensor of FIG. 1.

FIG. 2 provides a plan view 200 that corresponds to the line A-A' of FIG. 1. As shown by the plan view 200, the metal half-shields 105 is present under only a fraction of the microlenses 109 (see FIG. 1). In some embodiments, from about 2% to about 10% of the microlenses 109 have the metal half-shields 105. The metal half-shields 105 may be divided into left side half-shields 105A and right side half-shields 105B. A first angular response curve may be generated from PDAF pixels under left side half-shields 105A in an ROI. A second angular response curve may be generated from PDAF pixels under right side half-shields 105B in the ROI. PDAF may vary a lens position until peaks of the first angular response curve and the second angular response curve coincide.

An encapsulation layer 115 may be disposed over and along the sidewalls of the composite grid 193. A dielectric 113 may separate the composite grid 193 from the back side 191. The metal layer 121 may be grounded to the semiconductor body 185. This grounding may be provided by ground bars (not shown) disposed in a peripheral area (not shown) of the semiconductor body 185, which is outside the image sensing area.

Some of the photodetector pixels that include photodiodes 181 (see FIG. 1) are image sensing pixels and others are PDAF photodetector pixels. There is at least one PDAF photodetector pixel for each metal half-shield 105. In some embodiments where there are four photodetector pixels in a 2×2 array under each microlens 109, two diagonally opposite photodetector pixels are PDAF pixels. Differences between image sensing pixels and PDAF pixels may be found in the circuitry to which the corresponding photodiodes 181 are connected. In particular, there may be differences in the amplification circuitry connected to these different types of photodetector pixels.

Returning to FIG. 1, the metal layer 121 may have any suitable composition and thickness. In some embodiments, the metal layer 121 comprises aluminum (Al), copper (Cu), tungsten (W), or the like. In some embodiments, the metal layer 121 comprises tungsten (W) or the like. These materials have good process compatibility and light blocking capability. In some embodiments, the metal layer 121 has a thickness in the range from about 50 nm to about 500 nm. In some embodiments, the metal layer 121 has a thickness in the range from about 100 nm to about 300 nm. These thicknesses provide effective light blocking.

The total thickness of the composite grid 193 relates to a thickness of the color filters 101 and may be varied according to provide a targeted focusing distance between the mircolenses 109 and the photodiodes 181. In some embodiments, the total thickness is in the range from about 100 nm to about 1000 nm. In some embodiments, the total thickness is in the range from about 200 nm to about 600 nm. The thickness of the metal layer 121 may be determined so as to provide a sufficient thickness for light blocking. The thickness of the antireflective coating 119 is a thickness that provides destructive interference at a chosen wavelength. The remaining thickness may be provided by the dielectric layer 117.

In some embodiments, the microlenses 109 are made from polymer and have a refractive index in the range from about 1.4 and 1.7. Refractive index varies somewhat with wavelength. For purposes of the present disclosure, the refractive index is the refractive index at a wavelength of 520 nm. The dielectric layer 117, which is between the microlenses 109 and the antireflective coating 119, may be silicon dioxide ($SiO_2$) or the like. Silicon dioxide has a refractive index of about 1.45. The encapsulation layer 115 is optional. Where included the encapsulation layer 115 may also be silicon dioxide ($SiO_2$) or the like. These choices avoid refractive index contrasts that could cause reflections before the incident radiation reaches the antireflective coating 119.

In some embodiments, the antireflective coating 119 comprises a quarter-wave layer. In some embodiments, the quarter-wave layer has a quarter wavelength thickness for a wavelength in the visible spectrum, which is from about 400 nm to about 700 nm. In some embodiments, the quarter-wave layer has a quarter wavelength thickness for a wavelength in the green portion of the spectrum, which is from about 495 nm to about 570 nm.

In order to provide destructive interference, the quarter-wave layer has refractive index contrasts with the interfacing mediums above and below the quarter-wave layer. Where the quarter-wave layer is in direct contact with the metal layer 121, this constraint is easily realized: the refractive index of the metal layer 121 is effectively high. If silicon dioxide is immediately above the quarter-wave layer, then it is desirable for the quarter-wave layer to have a refractive index of at least about 1.7. In some embodiments, the quarter-wave layer has a refractive index of at least about 1.9.

In some embodiments, the antireflective coating 119 comprises a quarter-wave layer of silicon oxynitride ($SiO_xN_y$) or the like. The refractive index of silicon oxynitride is variable between the refractive index of silicon dioxide ($SiO_2$), which is about 1.45 and the refractive index of silicon nitride (SiN), which is about 2.0. The refractive index depends on the proportions of oxygen and nitrogen in the silicon oxynitride. In some embodiments, the composition is selected to provide a refractive index of at least about 1.7. In some embodiments, the composition is selected to provide a refractive index of at least about 1.9. In some embodiment, the antireflective coating 119 comprises a layer of silicon oxynitride having a thickness in the range from about 50 nm to about 103 nm. In some embodiment, the antireflective coating 119 comprises a layer of silicon oxynitride having a thickness in the range from about 73 nm to about 84 nm.

In some embodiments, the antireflective coating 119 comprises a layer of tantalum pentoxide ($Ta_2O_5$) or the like. The refractive index of tantalum pentoxide is about 2.1. In some embodiment, the antireflective coating 119 comprises a layer of tantalum pentoxide having a thickness in the range from about 47 nm to about 83 nm. In some embodiment, the antireflective coating 119 comprises a layer of tantalum pentoxide having a thickness in the range from about 59 nm to about 68 nm. Tantalum pentoxide has good optical properties and good process compatibility.

In some embodiments, the antireflective coating 119 comprises a layer of titanium nitride (TiN) or the like. The refractive index of titanium nitride can vary but is typically from about 2.1 to about 2.4. In some embodiment, the antireflective coating 119 comprises a layer of titanium nitride having a thickness in the range from about 41 nm to about 83 nm. In some embodiment, the antireflective coating 119 comprises a layer of titanium nitride having a thickness in the range from about 52 nm to about 68 nm. A titanium nitride layer may exhibit plasmonic effects that help suppress reflections.

In some embodiments, the antireflective coating 119 comprises a layer of titanium dioxide ($TiO_2$) or the like. The refractive index of titanium dioxide can vary but is typically from about 2.4 to about 2.9. In some embodiment, the antireflective coating 119 comprises a layer of titanium dioxide having a thickness in the range from about 34 nm to about 73 nm. In some embodiment, the antireflective coating 119 comprises a layer of titanium dioxide having a thickness in the range from about 43 nm to about 61 nm. Titanium dioxide combines a high refractive index with good optical properties to make it particularly suitable for forming an antireflective coating over the metal layer 121, which may have a very high effective reflective index. The high refractive index of titanium dioxide is also conducive to using titanium dioxide as lower layer in a stack of multiple quarter-wave layers adapted to cancel reflections over a range of wavelengths.

Figure 3:
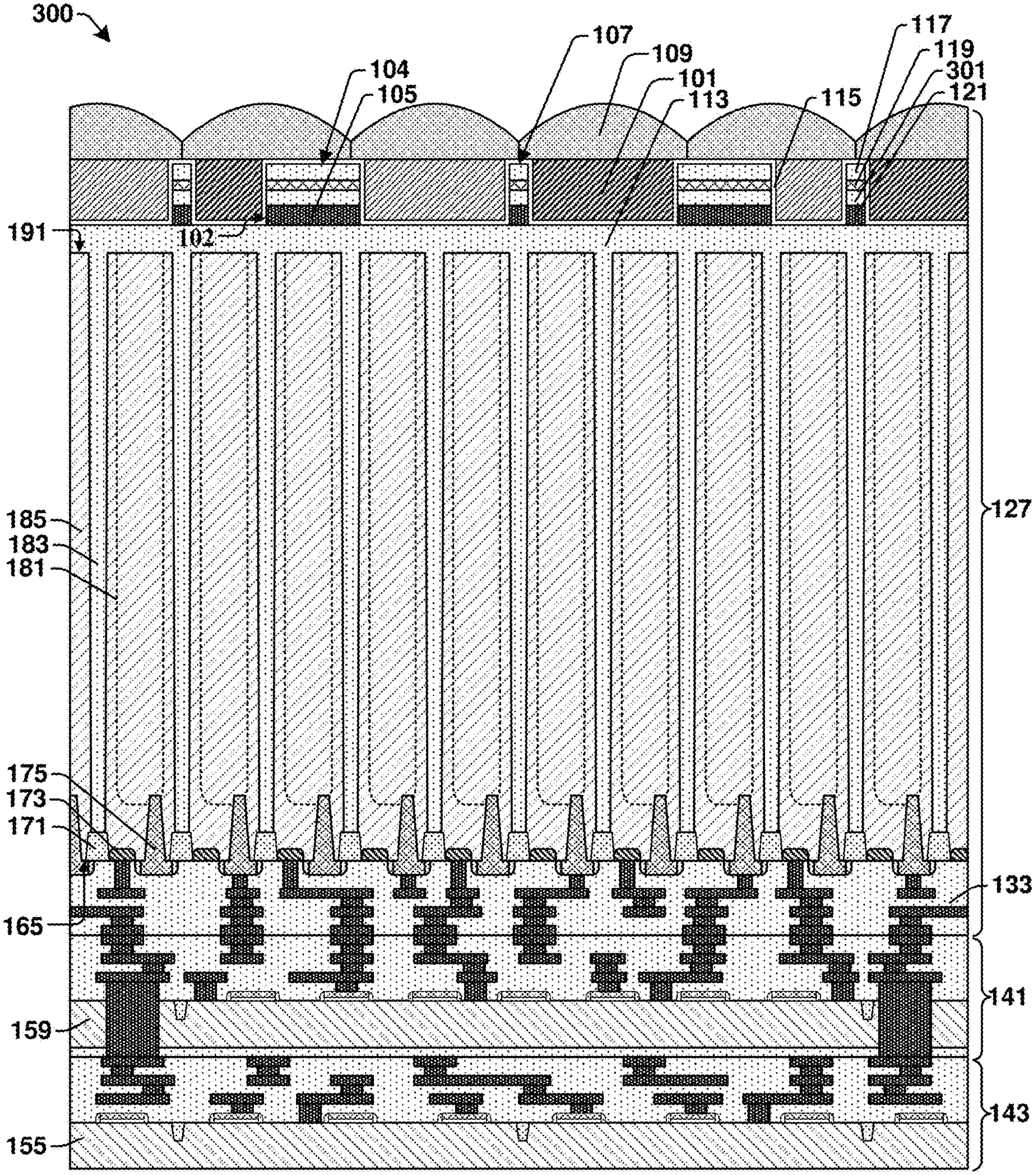
FIG. 3 illustrates a cross-sectional view of an image sensor according to another embodiment.

FIG. 3 illustrates a cross-sectional view of an image sensor 300 according to some other embodiments. The image sensor 300 of FIG. 3 is like the image sensor 100 of FIG. 1 except that in the image sensor 300 a gap layer 301 is between the antireflective coating 119 and the metal layer 121. The gap layer 301 may include one or more layers of any suitable compositions and thicknesses optionally including conductive or dielectric layers. The gap layer 301 may be, for example, a layer that provides adhesion between the antireflective coating 119 and the metal layer 121. At least an upper portion of the gap layer 301 has a refractive index contrast with the antireflective coating 119. In some embodiments, the gap layer 301 is silicon dioxide. In some embodiments, the gap layer 301 has the same composition as the dielectric layer 117.

Figure 4:
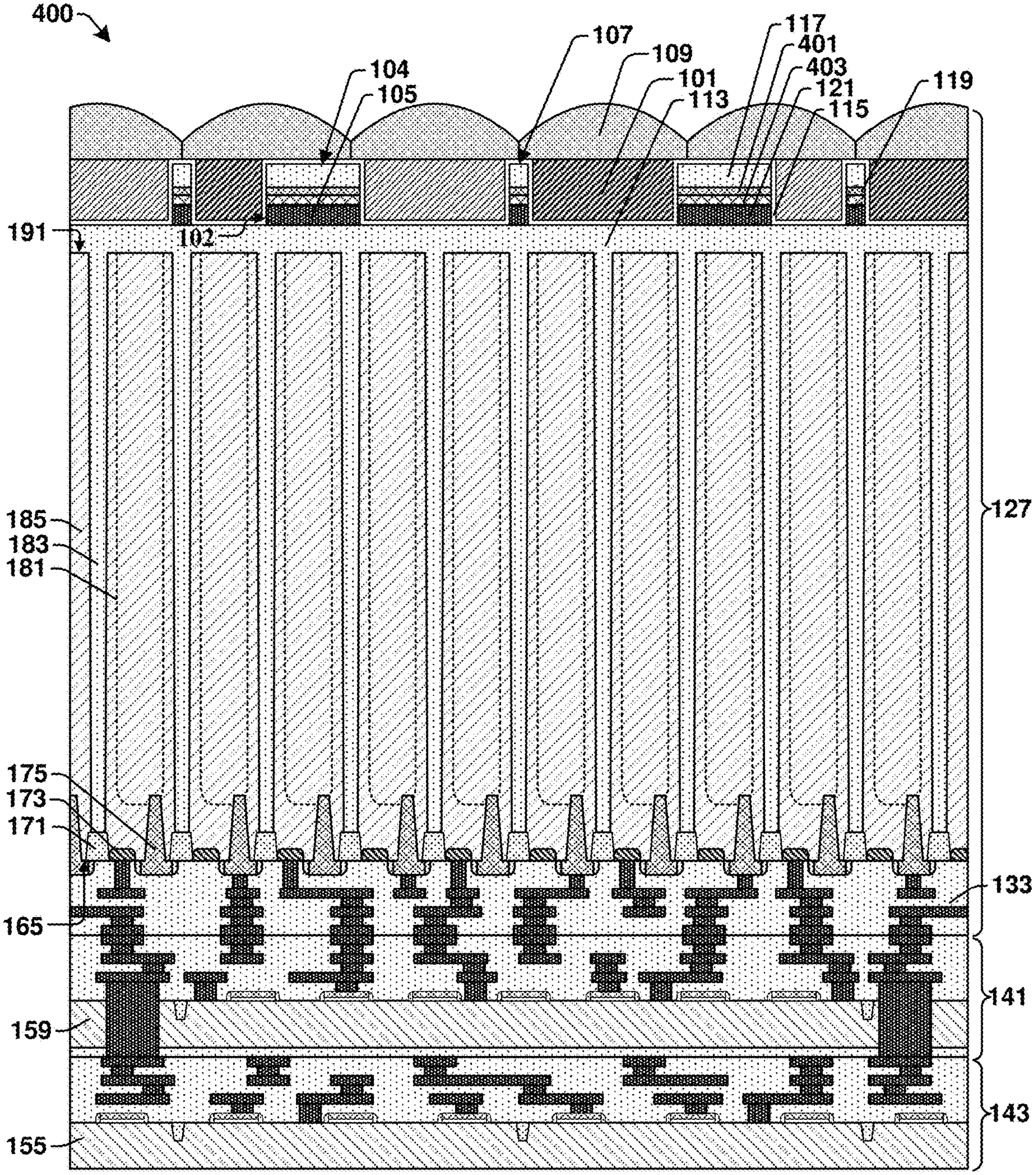
FIG. 4 illustrates a cross-sectional view of an image sensor according to another embodiment.

FIG. 4 illustrates a cross-sectional view of an image sensor 400 according to some other embodiments. The image sensor 400 is like the image sensor 100 of FIG. 1 except that in the image sensor 400 the antireflective coating 119 includes at least a first quarter-wave layer 401 and a second quarter-wave layer 403. In some embodiments, the second quarter-wave layer 403 has a higher refractive index than the first quarter-wave layer 401. The two quarter-wave layers may be adapted for canceling reflections at different wavelength and can together provide better antireflection performance than can a single quarter-wave layer, particularly where the lower quarter-wave layer 403 has a higher refractive index than the upper quarter-wave layer 401.

Figure 5:
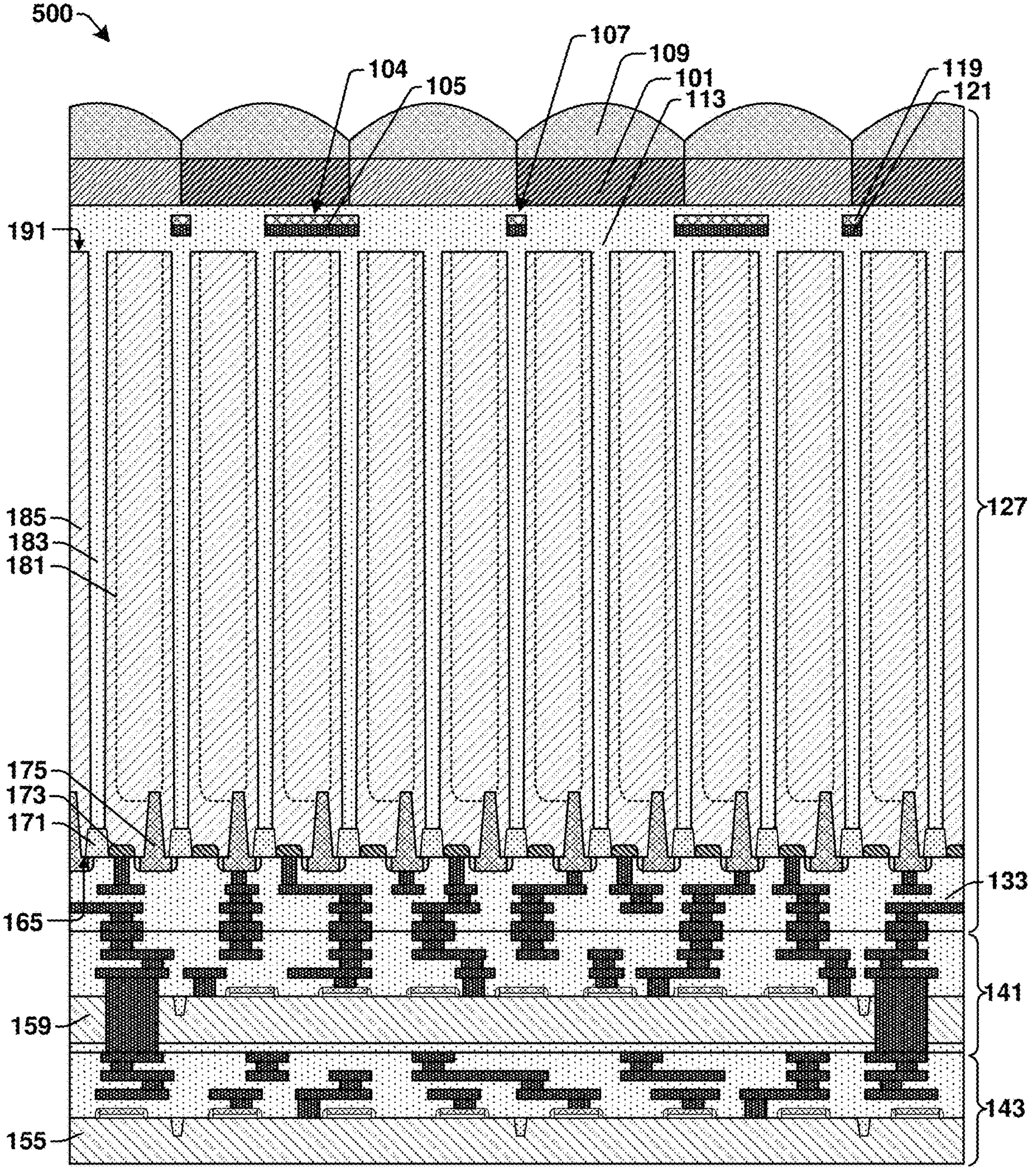
FIG. 5 illustrates a cross-sectional view of an image sensor according to another embodiment.

FIG. 5 illustrates a cross-sectional view of an image sensor 500 according to some other embodiments. The image sensor 500 is like the image sensor 100 of FIG. 1 except that in the image sensor 500 the metal layer 121 and the antireflective coating 119 are below the color filters 101. Otherwise, the metal layer 121 and the antireflective coating 119 may have the same composition and geometry as they do in the image sensor 100 of FIG. 1. The image sensor 500 of FIG. 5 may have a higher quantum efficiency than the image sensor 100 of FIG. 1 for some applications.

FIGS. 6-21 provide a series of cross-sectional views 600-2100 that illustrate an image sensing integrated circuit device according to the present disclosure at various stages of manufacture according to a process of the present disclosure. Although FIGS. 6-21 are described in relation to a series of acts, it will be appreciated that the order of the acts may in some cases be altered and that this series of acts are applicable to structures other than the ones illustrated. In some embodiments, some of these acts may be omitted in whole or in part. Furthermore, although FIGS. 6-21 are described in relation to a series of acts, it will be appreciated that the structures shown in FIGS. 6-21 are not limited to a method of manufacture but rather may stand alone as structures separate from the method.

Figure 6:
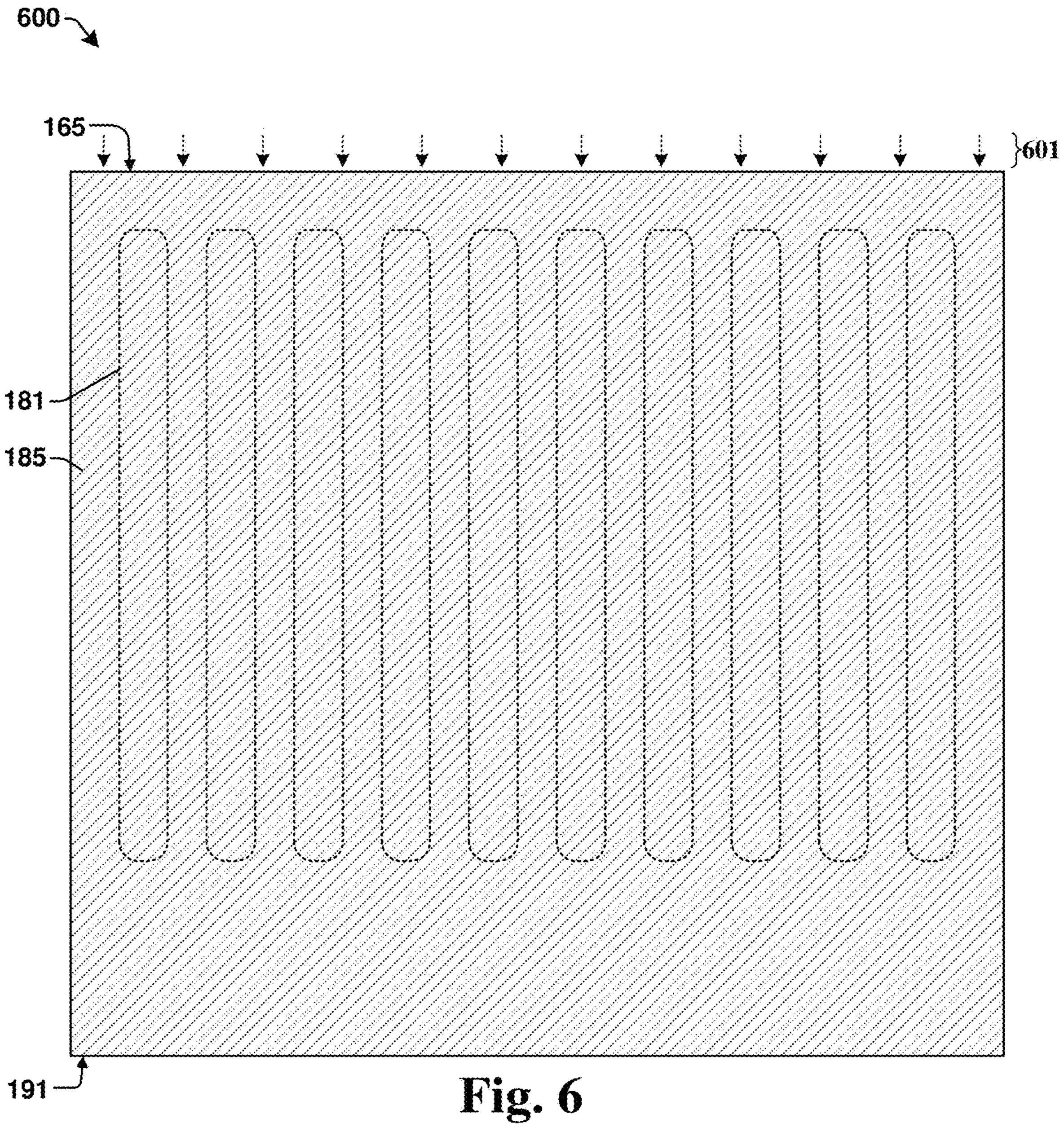
FIGS. 6-21 illustrate a method of manufacturing an image sensor in accordance with some embodiments.

As illustrated by the cross-sectional view 600 of FIG. 6, the method may begin with implanting dopants 601 through the front side of the semiconductor body 185 so as to form photodiodes 181. The dopants may be implanted in a series of steps that include, for example, a deep n-well implant, a shallow p-well implant, and the like. Some of these dopant implantations may be carried out with masks and others without. The semiconductor body 185 may be cut from a single crystal and may be any type of semiconductor. The semiconductor may be, for example, silicon (Si), a group III-V semiconductor or some other binary semiconductor, a tertiary semiconductor (e.g., AlGaAs), a higher order semiconductor, or the like. In some embodiments, the semiconductor body 185 is or comprises silicon (Si) or the like.

Figure 7:
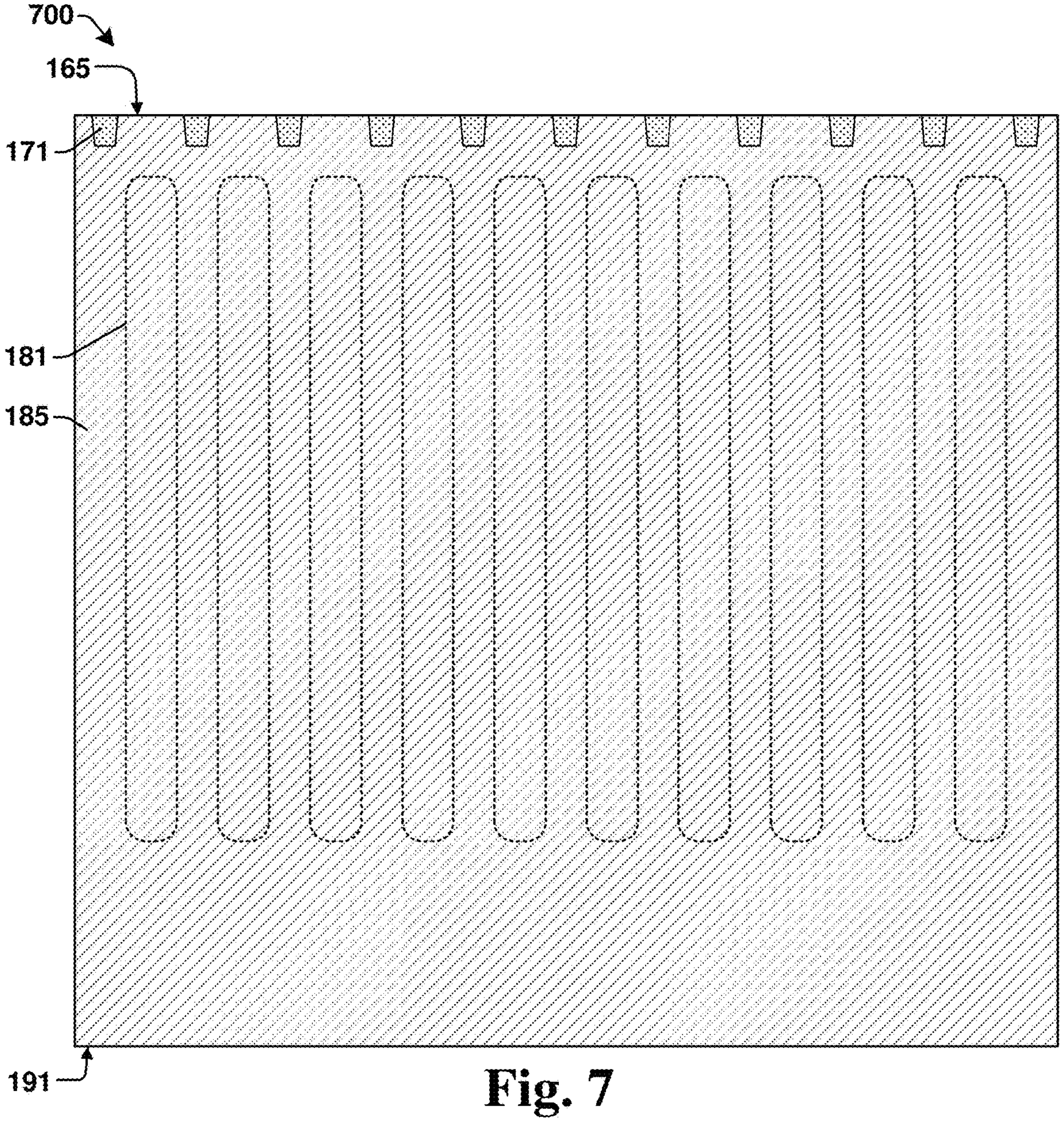

As illustrated by the cross-sectional view 700 of FIG. 7, the method optionally continues with forming shallow trench isolation (STI) structures 171. Forming the STI structures 171 may include forming a mask and etching trenches in the front side 165, stripping the mask, depositing a dielectric so as to fill the trenches, and planarizing. The dielectric may be silicon dioxide ($SiO_2$), the like, or any other suitable dielectric.

Figure 8:
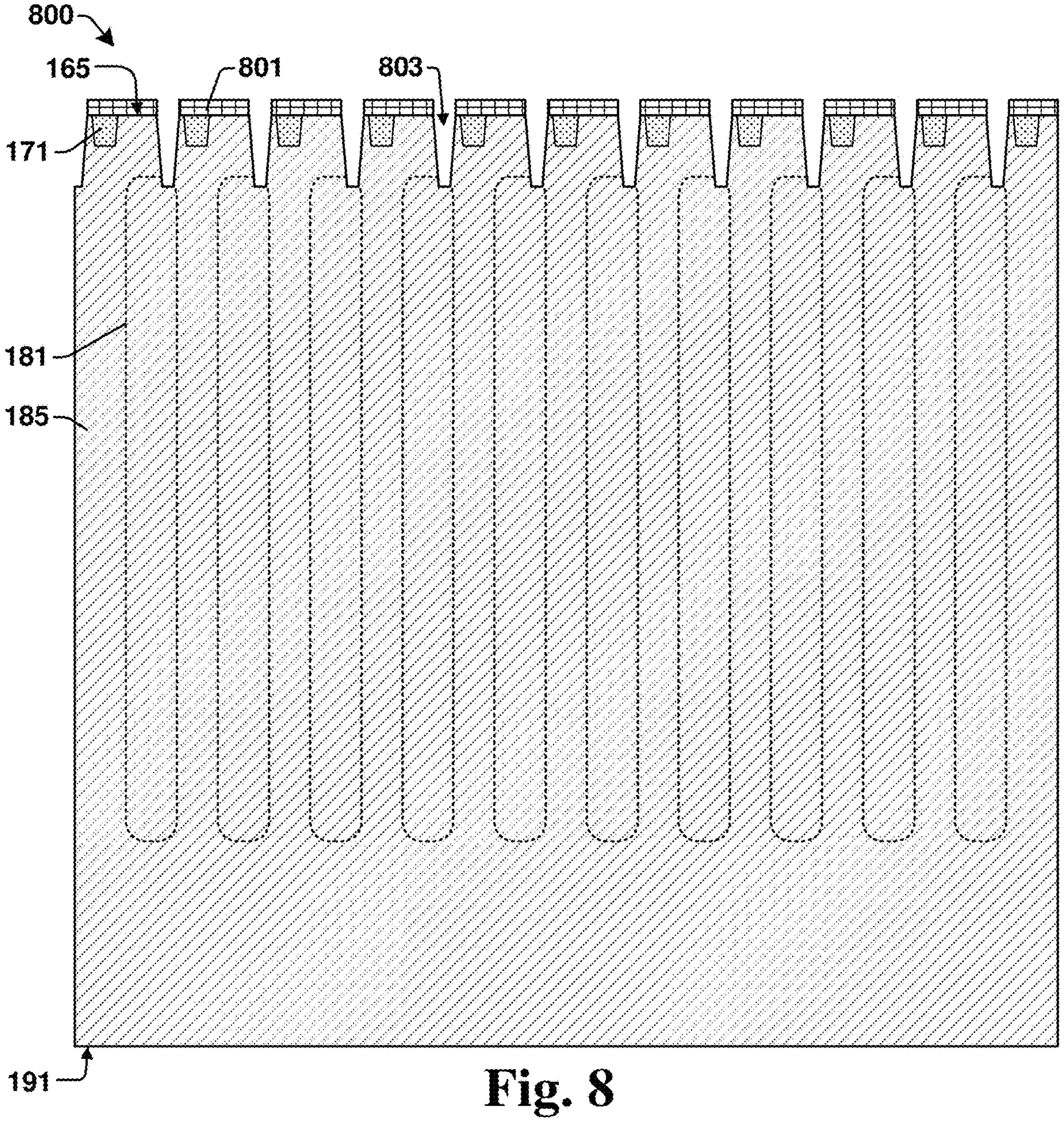

As illustrated by the cross-sectional view 800 of FIG. 8, a mask 801 may be formed and used to etch trenches 803. The mask 801, and other masks used throughout this process, may be patterned by photolithography, e-beam lithography, the like, or any other suitable method. The mask may include a photoresist mask and/or a hard mask. A hard mask may be patterned from a photoresist mask. After etching, the mask 801 may be stripped.

Figure 9:
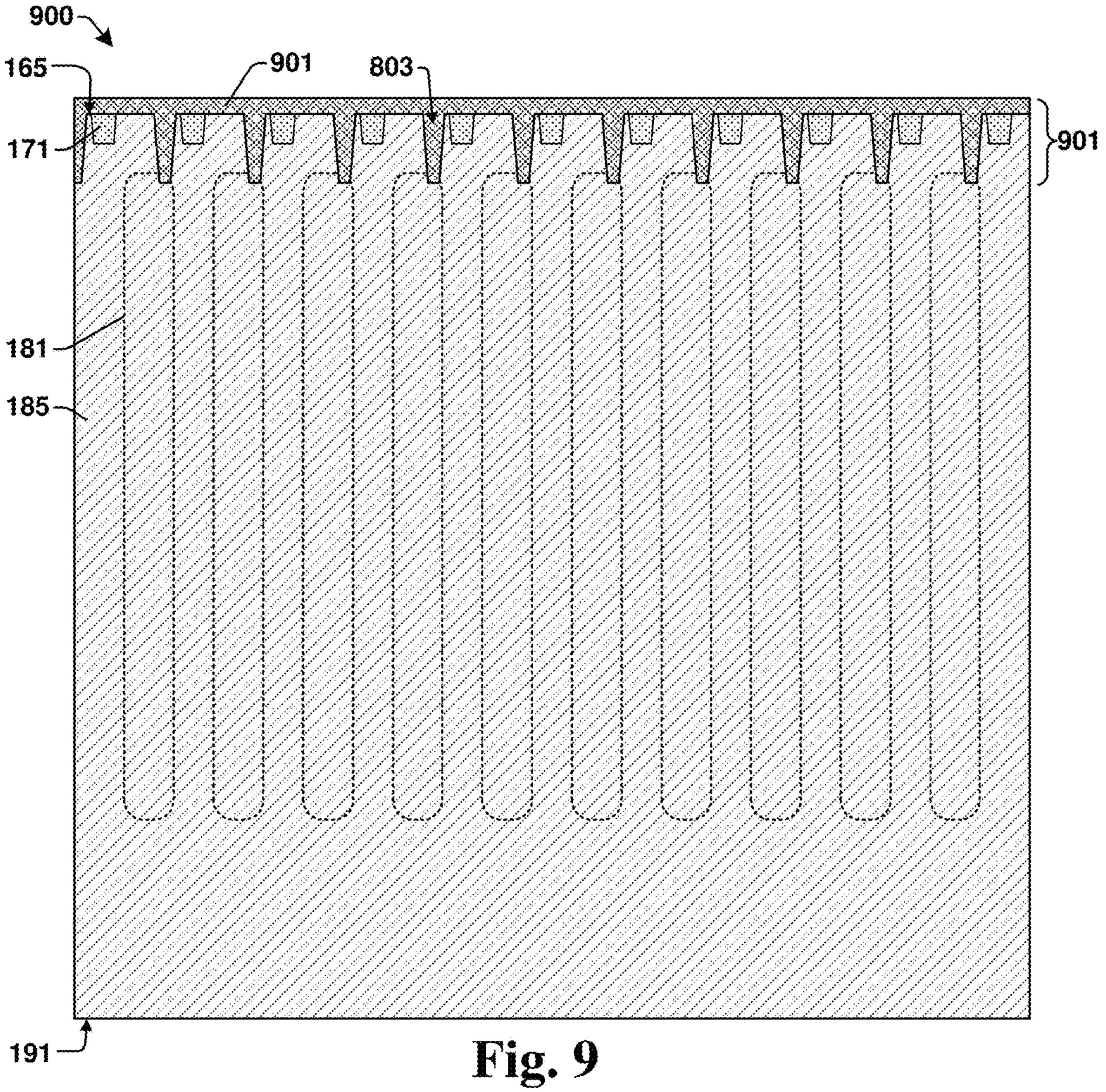

As illustrated by the cross-sectional view 900 of FIG. 9, a gate stack 901 may then be formed. The gate stack 901 fills the trenches 803. The gate stack 901 may include a gate dielectric layer and a gate electrode layer. The gate dielectric layer may be an oxide, the like, or some other material suitable for a gate dielectric layer. The gate electrode layer may be polysilicon, the like, or some other suitable material. These layers may be deposited by physical vapor deposition (PVD), chemical vapor deposition (CVD), atomic layer deposition (ALD), the like, or any other suitable process. The gate dielectric layer may alternatively be formed by oxidation. Optionally, the gate electrode layer is planarized. The planarization process may be chemical mechanical polishing (CMP) or the like.

Figure 10:
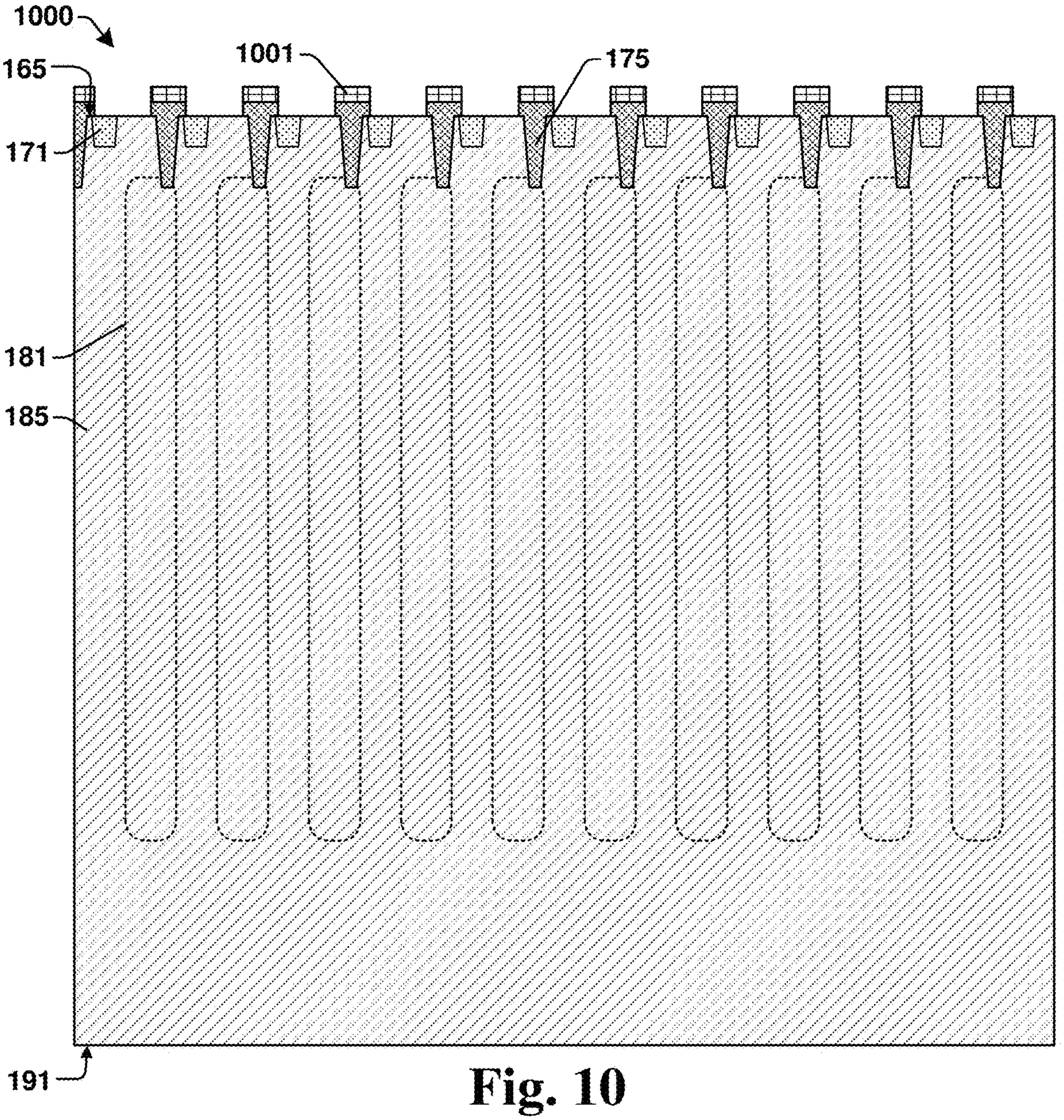

As shown by the cross-sectional view 1000 of FIG. 10, a mask 1001 may be formed and used to pattern transfer gates 175 and/or other gates from the gate stack 901. After patterning, the mask 1001 may be stripped.

Figure 11:
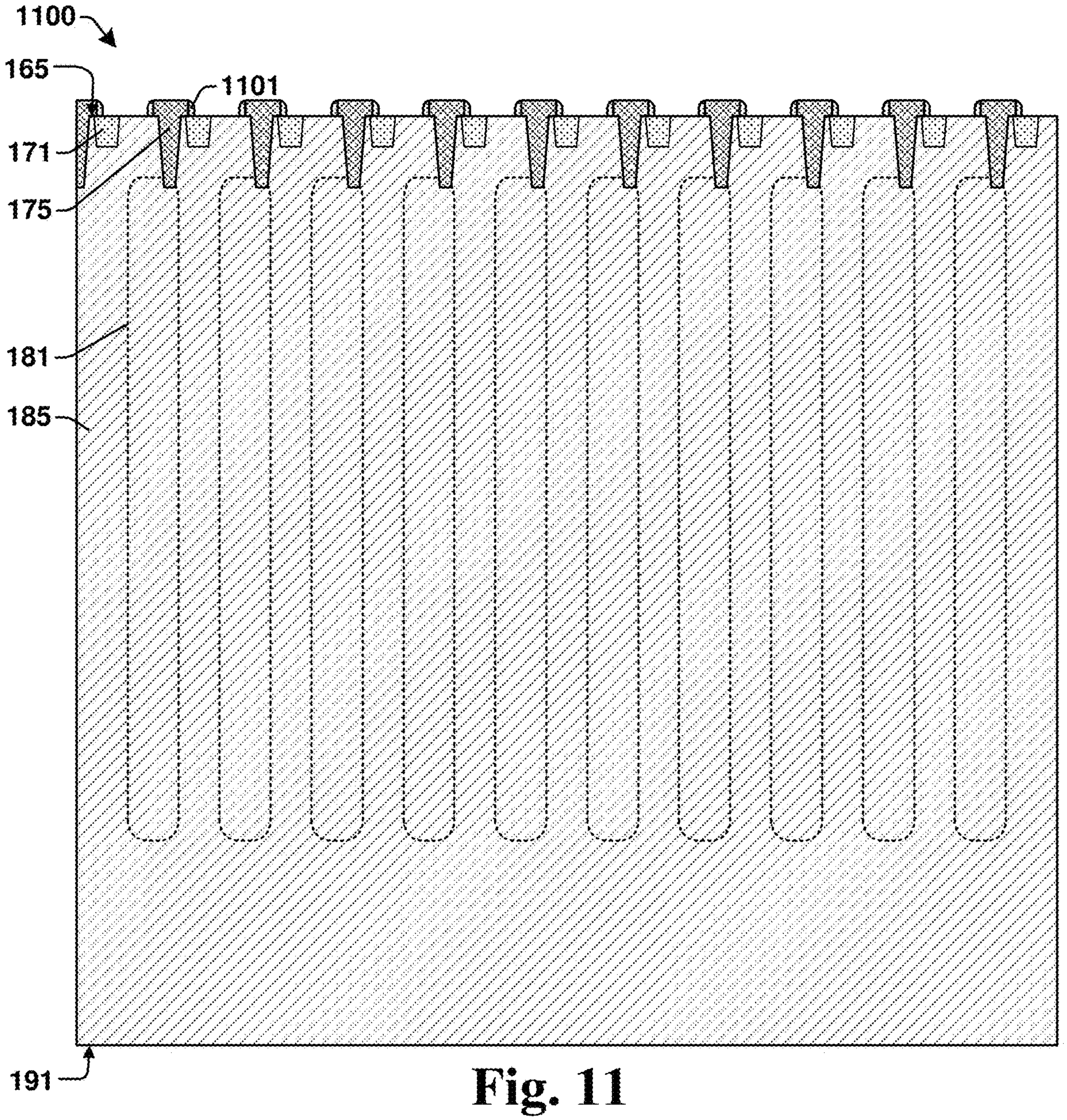

As shown by the cross-sectional view 1100 of FIG. 11, spacers 1101 may be formed around the transfer gates 175. The spacers 1101 may be formed by depositing a spacer material followed by anisotropic etching. The spacer material may include one or more layers of any suitable dielectrics. The spacer material may be or comprise, for example, silicon nitride (SiN), silicon oxynitride (SiON), silicon dioxide ($SiO_2$), a high-κ dielectric, or the like. The spacer material may be deposited by ALD, CVD, PVD, the like, or any other suitable process.

Figure 12:
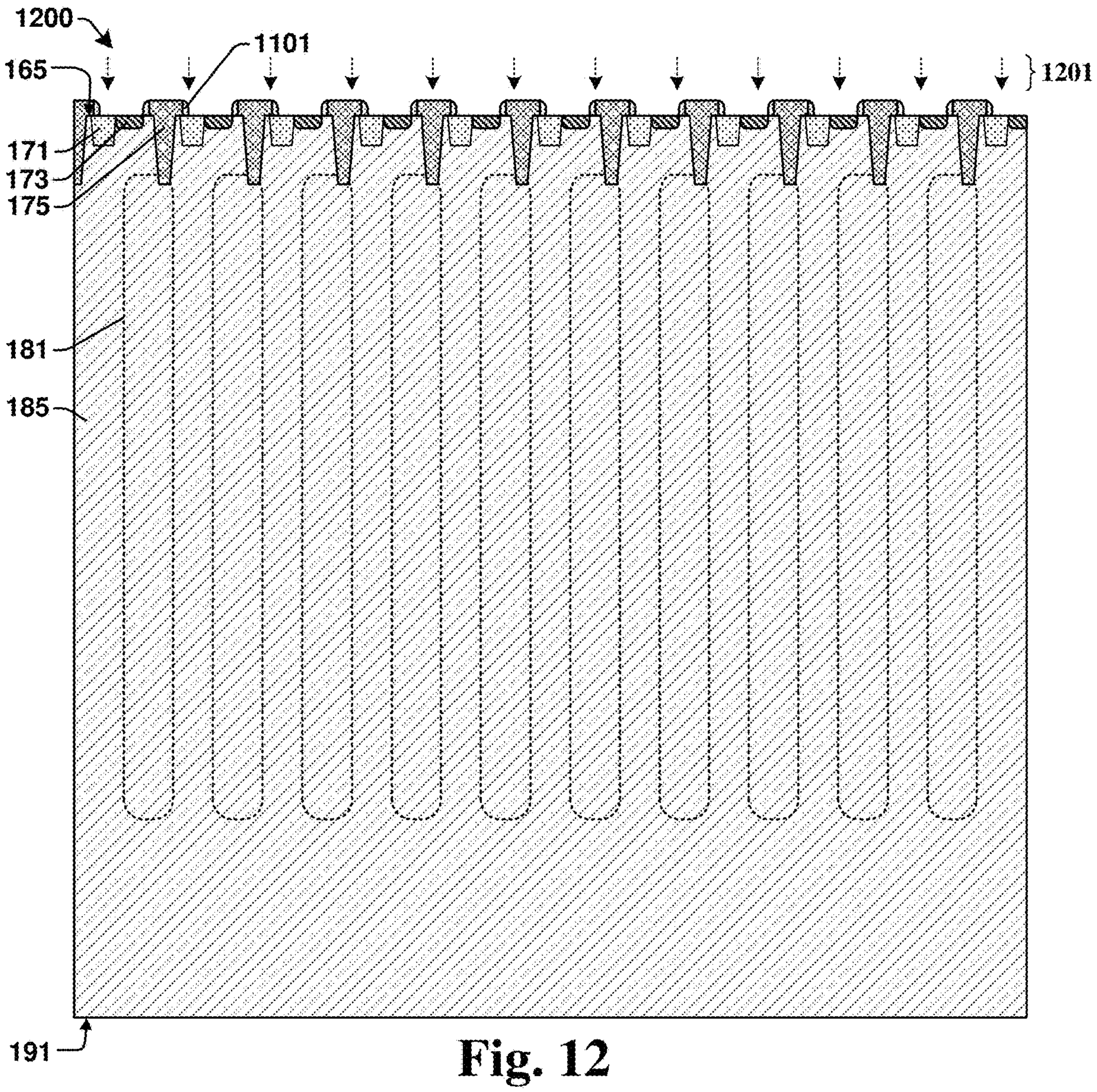

As shown by the cross-sectional view 1200 of FIG. 12, dopants 1201 may be implanted to form floating diffusion regions 173. A mask (not shown) is optionally formed prior to implanting the dopants. This dopant implantation process may form other structures such as source/drain regions for other transistors (not shown). The floating diffusion regions 173 may be aligned to the spacers 1101.

Figure 13:
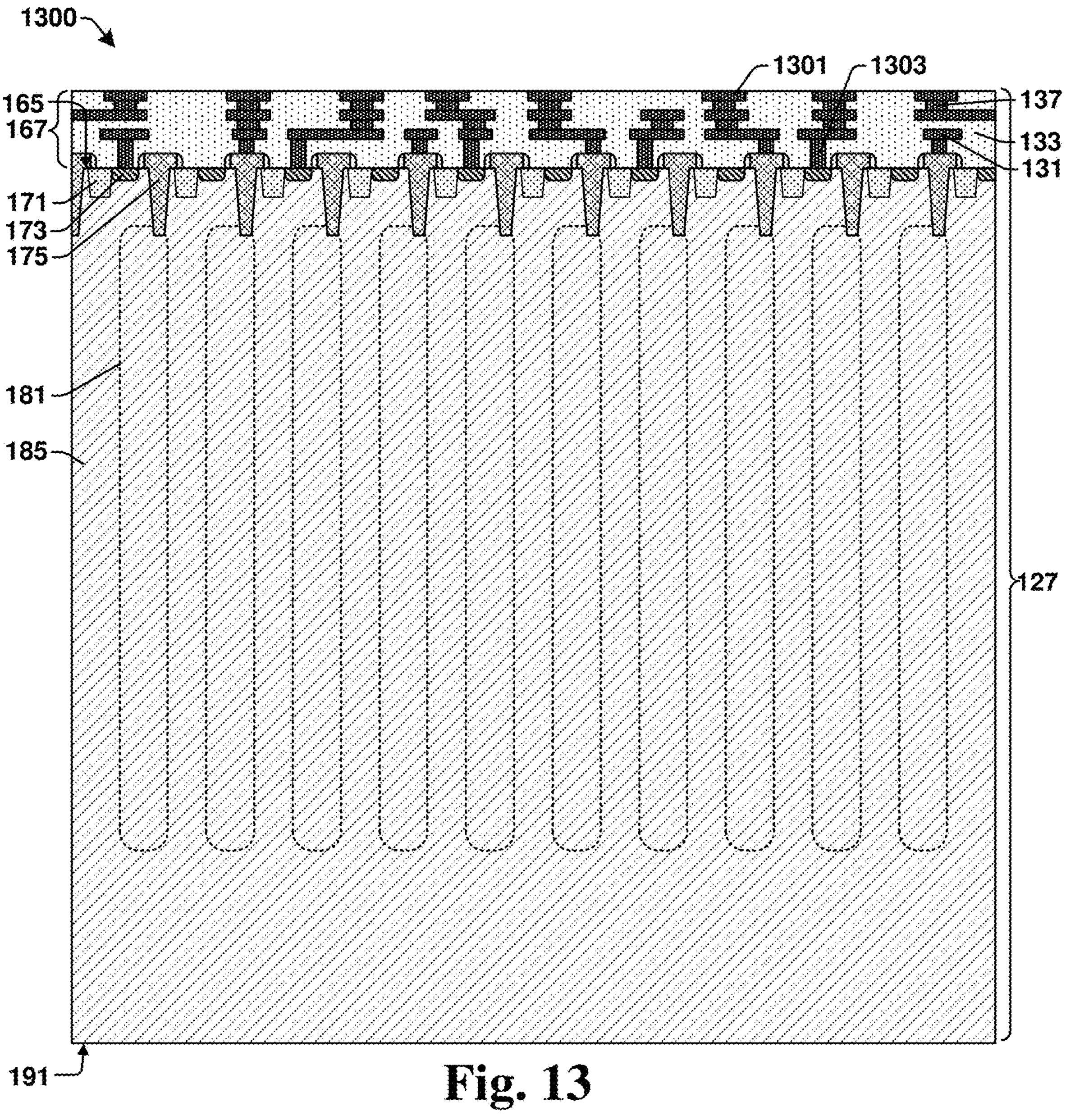

As shown by the cross-sectional view 1300 of FIG. 13, the process may continue with formation of the metal interconnect structure 167 over the front side 165. In some embodiments, the metal interconnect structure 167 includes a plurality of metallization layers, each of which may be formed using a damascene or dual damascene process. The metal interconnect structure 167 include wires 131 and the vias 137 in a matrix of interlevel dielectric 133. The wires 131 and the vias 137 may be or comprise copper (Cu), tungsten (W), ruthenium (Ru), palladium (Pd), platinum (Pt), cobalt (Co), nickel (Ni), zirconium (Zi), titanium (Ti), tantalum (Ta), aluminum (Al), conductive carbides, oxides, alloys of these metals, the like, or any other suitable conductive materials. The wires 131 and the vias 137 may also include a diffusion barrier layer such as titanium (Ti), tantalum (Ta), titanium nitride (TiN), tantalum nitride (TaN), or the like. The metal interconnect structure 167 may further include bonding pads 1301 and contact plugs 1303. These may have one of the foregoing compositions or a different composition. The conductive materials may be deposited by electroplating, electroless plating, ALD, CVD, PVD, the like, or any other suitable process.

The interlevel dielectric 133 may include one or more layers of silicon dioxide ($SiO_2$), a low-κ dielectric, or an extremely low-κ dielectric. A low-κ dielectric is one having a smaller dielectric constant than silicon dioxide ($SiO_2$). Silicon dioxide has a dielectric constant of about 3.9. Examples of low-κ dielectrics include organosilicate glasses (OSG) such as carbon-doped silicon dioxide, fluorine-doped silicon dioxide (otherwise referred to as fluorinated silica glass (FSG), organic polymer low low-κ dielectrics, and porous silicate glass. An extremely low-κ dielectric is a material having a dielectric constant of about 2.1 or less. An extremely low-κ dielectric material is generally a low-κ dielectric material with a porous structure. Porosity reduces the effective dielectric constant. The interlevel dielectric 133 may be deposited by ALD, CVD, PVD, the like, or any other suitable processes. The semiconductor body 185 and the metal interconnect structure 167 comprise the first chip 127.

Figure 14:
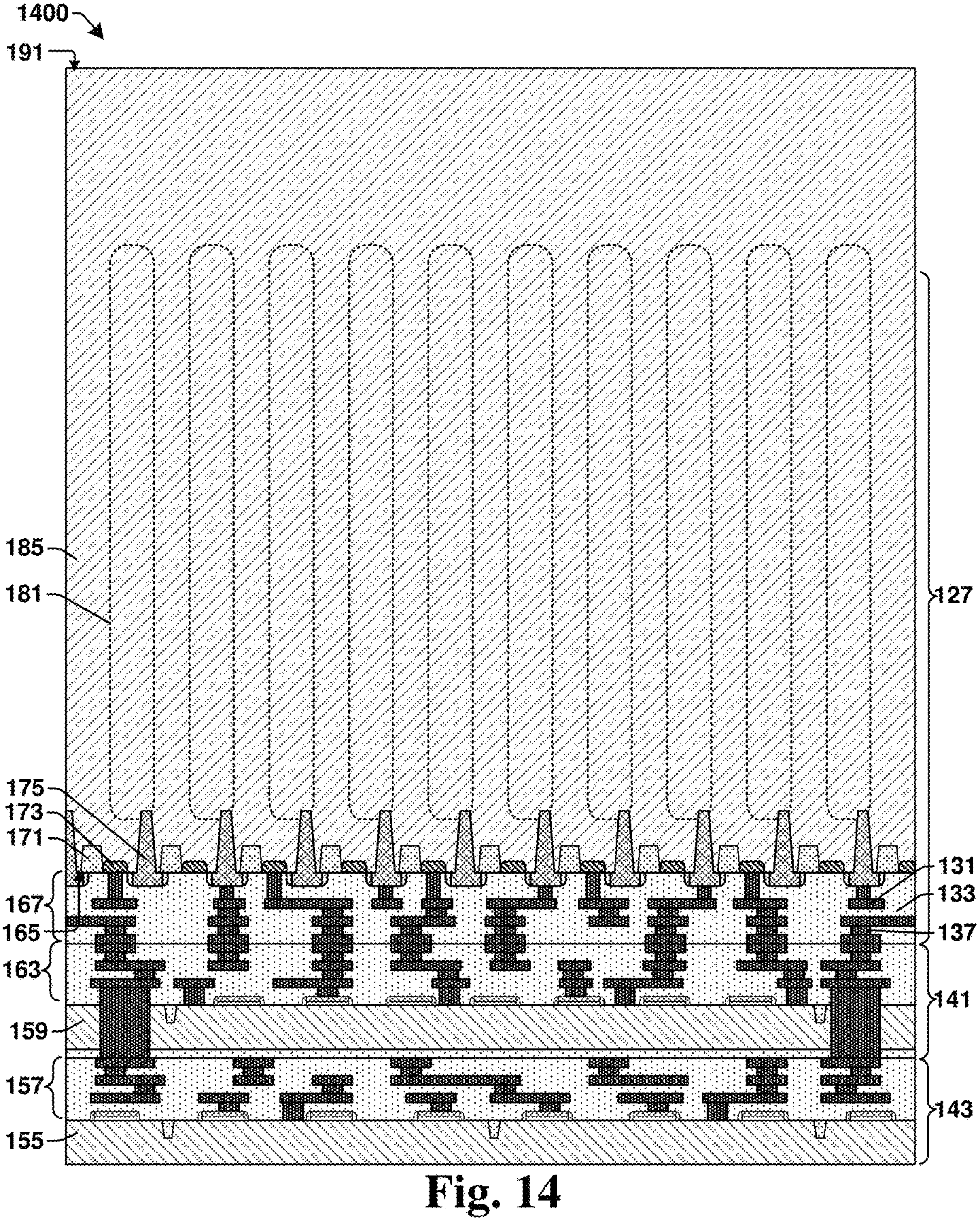

As shown by the cross-sectional view 1400 of FIG. 14, the first chip 127 may be inverted and bonded to the second chip 141, which may itself be bonded to a third chip 143. The second chip 141 includes a second semiconductor substrate 159 and a second metal interconnect structure 163. The third chip 143 includes a third semiconductor substrate 155 and a third metal interconnect structure 157. The second chip 141 may be bonded to the third chip 143 either before or after bonding to the first chip 127. The third chip 143 is optional. The bonding processes may be oxide-to-oxide bonding, metallic bonding, a combination thereof, the like, or any other suitable bonding processes.

Figure 15:
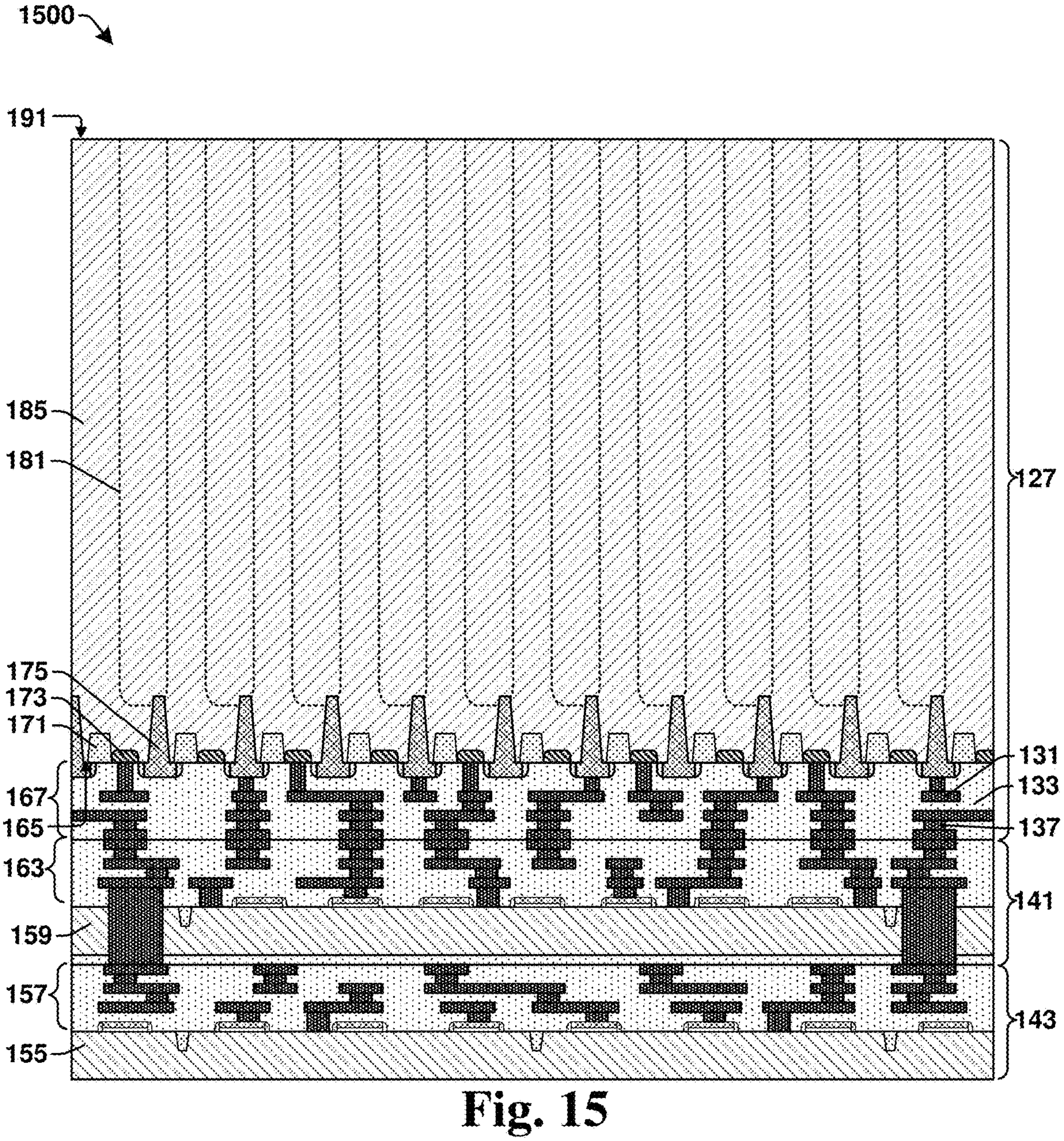

As shown by the cross-sectional view 1500 of FIG. 15, after bonding the semiconductor body 185 may be thinned from the back side 191. Thinning the semiconductor body 185 allows light to pass more easily to the photodiodes 181. The semiconductor body 185 may be thinned by etching, mechanical grinding, CMP, the like, or any other suitable process. In some embodiments, the semiconductor body 185 is thinned to about 5 μm or less. In some embodiments, the semiconductor body 185 is thinned to about 3 μm or less.

Figure 16:
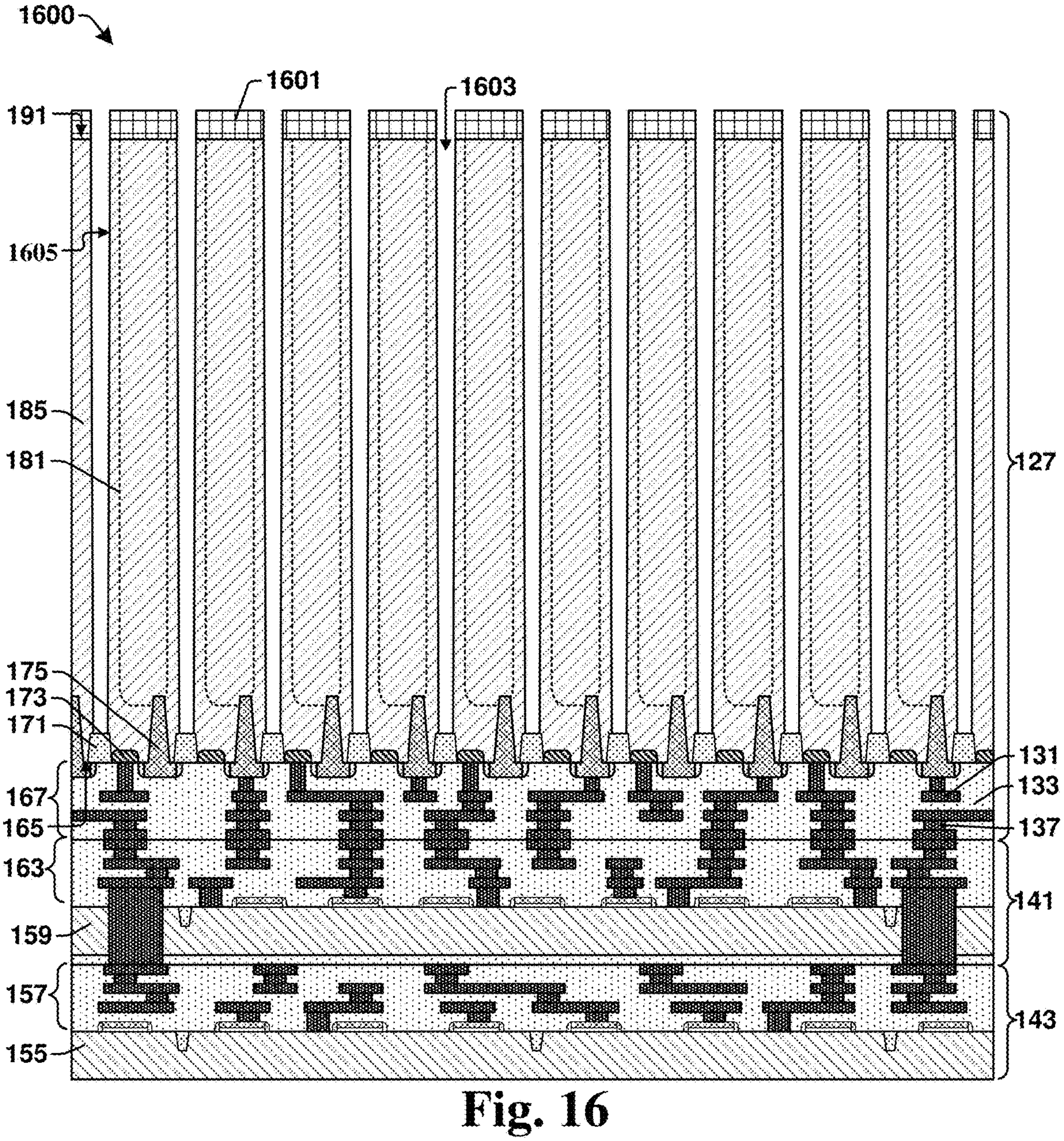

As shown by the cross-sectional view 1600 of FIG. 16, a mask 1601 may be formed and used to etch trenches 1603 in the semiconductor body 185. The trenches 1603 form a grid with segments between adjacent photodiodes 181. The trenches 1603 have internal sidewalls 1605 that will define an isolation structure. The trenches 1603 have a high aspect ratio. In some embodiments, the trenches 1603 have an aspect ratio of 15:1 or greater. In some embodiments, the trenches 1603 have an aspect ratio of 20:1 or greater. In some embodiments, the trenches 1603 have an aspect ratio of 25:1 or greater.

The trenches 1603 are formed by etching. In some embodiments, the etching is a multistep etch process in which the trenches are formed in increments. Forming an increment may include etching to a first depth followed by deposition of a protective layer on the trench sidewalls 1605. The protective layer may be, for example, an oxide or a carbide. Etching for the next increment breaks through the protective layer at the bottoms of the trenches. The protective layers reduce lateral etching and trench widening in the upper increments as the lower increments are being formed.

In some embodiments, the etching stops on the STI structures 171, which may have the same grid pattern as the trenches 1603. In some other embodiments, the etching stops on a contact etch stop layer (not shown) on the front side 165. In some other embodiments, the etching stops on a wire 131 or pad in the metal interconnect structure 167. These structures provide full isolation between adjacent photodiodes 181. Alternatively, the trenches 1603 stop short of the front side 165 and provide only partial isolation between adjacent photodiodes 181. In the process of this example, a back side DTI structure is formed. Alternatively, a front side DTI structure may be formed.

Continuing with the present example, the trenches 1603 may be filled as shown by the cross-sectional view 1600 of FIG. 16 to provide the DTI structure 183. In some embodiment, the trenches 1603 are filled with dielectric. In other embodiments, the trenches 1603 are lined with dielectric and then filled with conductive material to provide a conductive core. The conductive core may be grounded or may be coupled to a biasing voltage source.

The DTI structure 183 may comprise one or more dielectric layers. As these layers are deposited in the trenches 1603, they also deposit on the back side 191 where they form the dielectric 113. According, the layers of dielectric that make up the DTI structure 183 within the trenches 1603 are continuous with layers that make up the dielectric 113 on the back side 191. Some of these layers may be thicker on the back side 191 depending on the condition the deposition processes with which they are formed.

In some embodiments, the trenches 1603 are lined with a high-κ dielectric layer. The high-k dielectric passivates defects by forming an electric field that accumulates holes along the sidewalls 1605, thereby passivating charge carriers (e.g., electrons). The high-κ dielectric layer may be or comprise, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium oxide aluminum oxide ($HfO_2$—$Al_2O_3$), zirconium oxide ($ZrO_2$), tantalum oxide ($Ta_2O_5$), aluminum oxide ($Al_2O_3$), yttrium oxide ($Y_2O_3$), lanthanum oxide ($La_2O_3$), strontium titanium oxide ($SrTiO_3$), or the like and may have a thickness in the range from 5 to 50 Angstroms, for example. The high-κ dielectric layer may be deposited by ALD, CVD, PVD, the like, or any suitable process.

After lining, the trenches 1603 may be filled with an oxide such as silicon dioxide ($SiO_2$), tantalum pentoxide ($Ta_2O_5$), or the like. The fill may be deposited by ALD, CVD, PVD, the like, or any suitable process. In some embodiments, the dielectric 113 includes at least a layer of tantalum pentoxide or the like. Tantalum pentoxide has a refractive index between that of silicon (Si) and that of silicon dioxide. According, a layer of tantalum pentoxide can reduce reflections. Optionally, the dielectric 113 is planarized. Planarization may be by CMP, the like, or any other suitable process. Planarization provides a level surface on which to build the subsequent structure.

Figure 18:
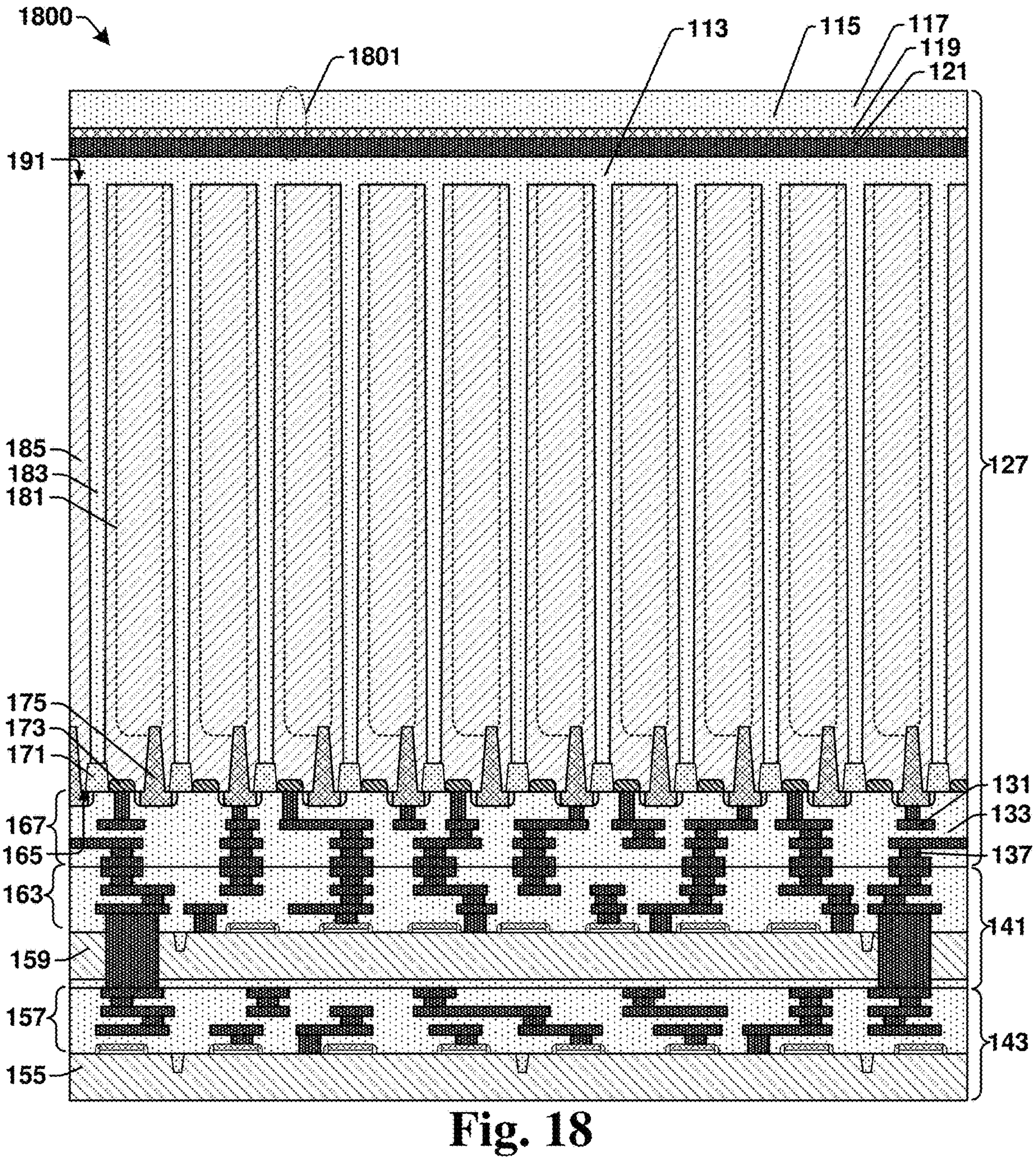

As shown by the cross-sectional view 1800 of FIG. 18, a composite grid stack 1801 is formed over the dielectric 113. The composite grid stack 1801 includes at least the metal layer 121 and the antireflective coating 119. In some embodiments, the composite grid stack 1801 include the dielectric layer 117. In some embodiments, the composite grid stack 1801 include a hard mask layer (not shown). A hard mask layer may be silicon nitride (SiN), the like, or any other suitable material. When included in the composite grid stack 1801, the hard mask layer may be removed at a later stage of processing.

The metal layer 121 may be formed by electroplating, electroless plating, ALD, CVD, PVD, the like, or any other suitable process. The antireflective coating 119 may be ALD, CVD, PVD, the like, or any other suitable process. In some embodiments, the antireflective coating 119 is formed by ALD. ALD allows precise control of layer thickness, and layer thickness affects the performance of the antireflective coating 119. The dielectric layer 117 may be ALD, CVD, PVD, the like, or any other suitable process.

Figure 19:
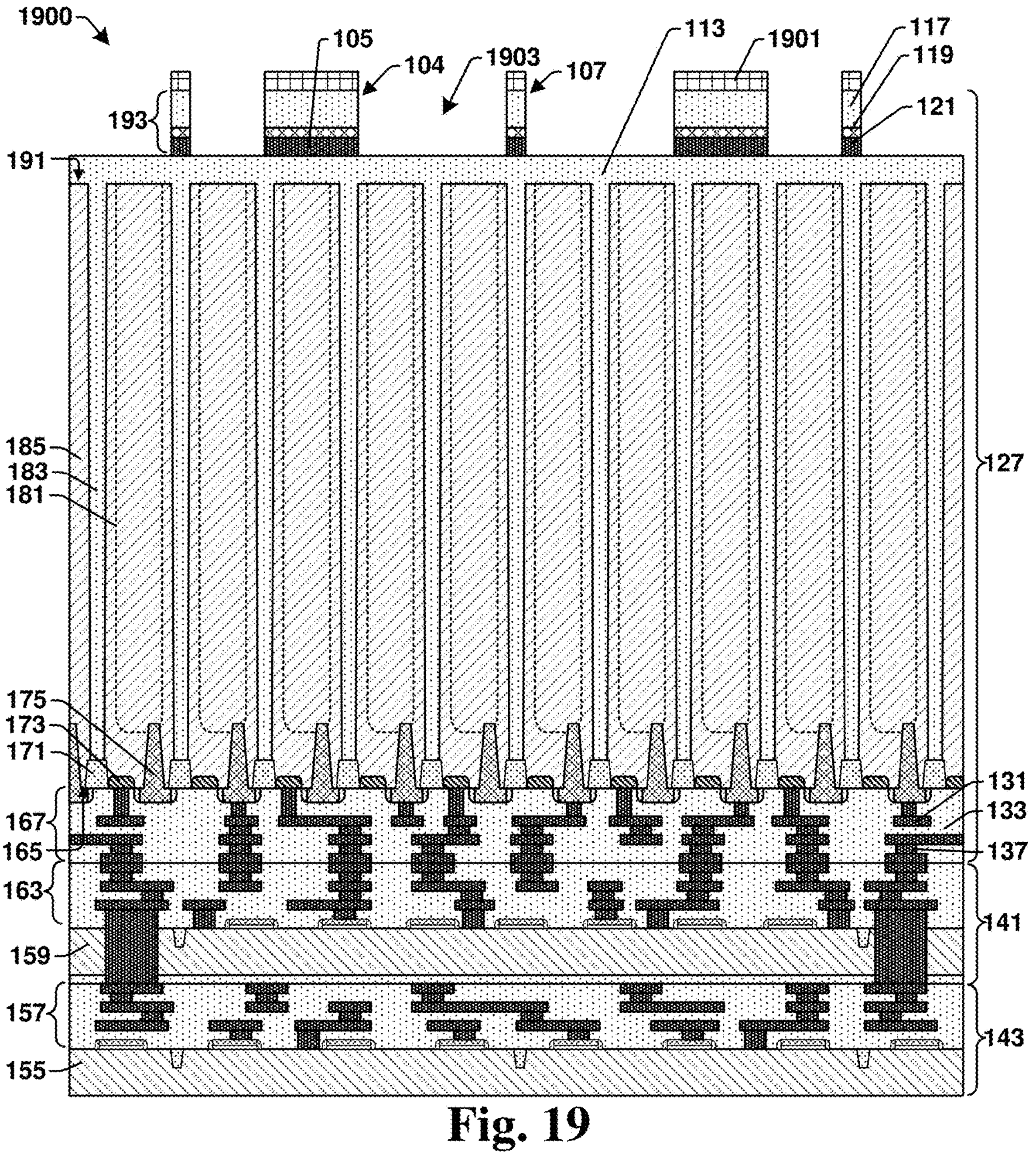

As shown by the cross-sectional view 1900 of FIG. 19, a mask 1901 is formed and used to pattern the composite grid stack 1801 to form the composite grid 193 including segments 104, segments 107, and metal half-shields 105. The mask 1901 may be a photoresist patterned by photolithography or e-beam lithography. Patterning using the mask 1901 may comprise dry etching, such as plasma etching or the like. The etch process conditions may be varied as the etch proceeds through the various layers of the composite grid stack 1801.

Figure 20:
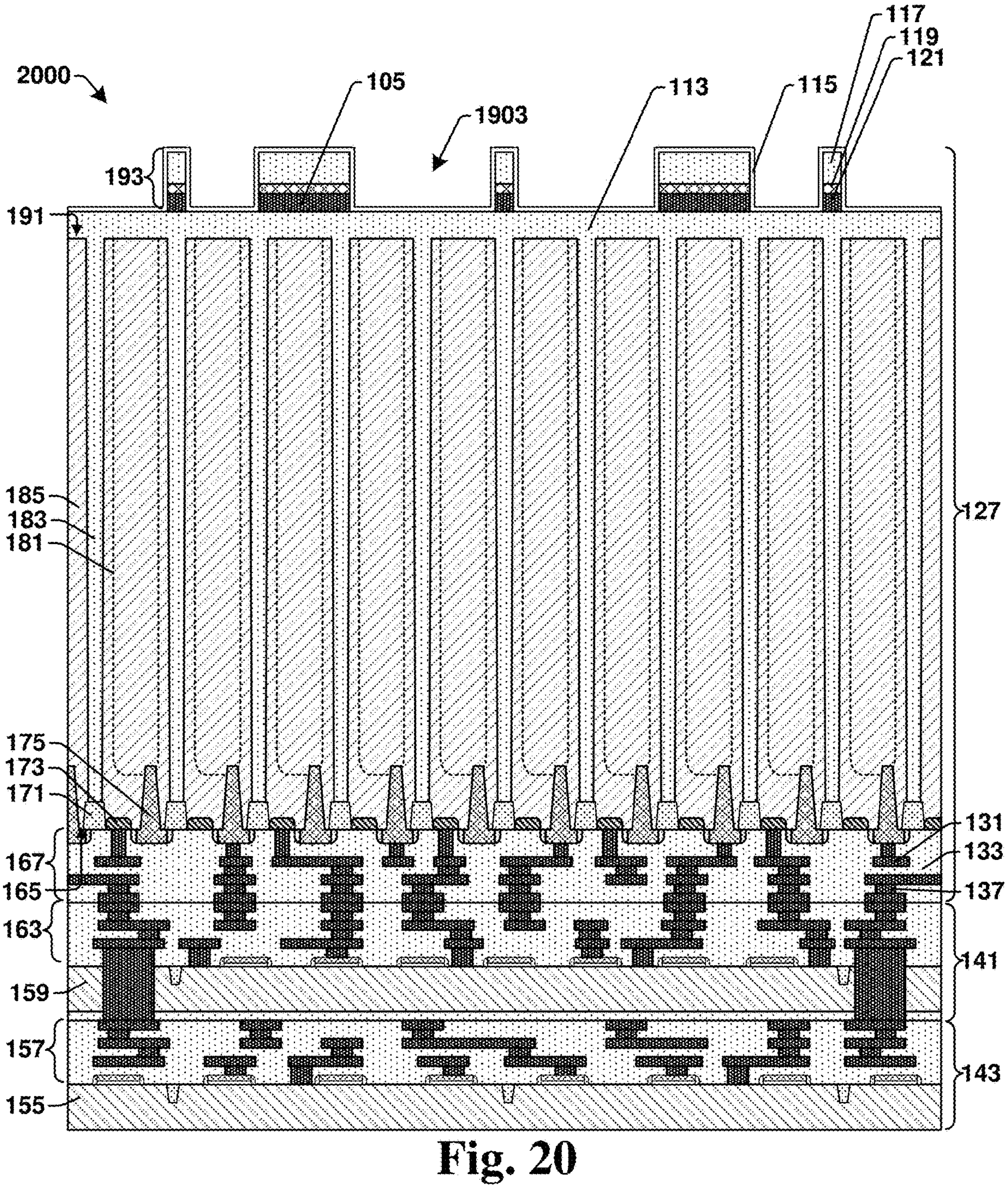

As shown by the cross-sectional view 2000 of FIG. 20, an encapsulation layer 115 may be formed over the composite grid 193. The encapsulation layer 115 may be a dielectric such as silicon dioxide ($SiO_2$) or the like. The encapsulation layer 115 may be formed by ALD, CVD, the like, or any other suitable process.

Figure 21:
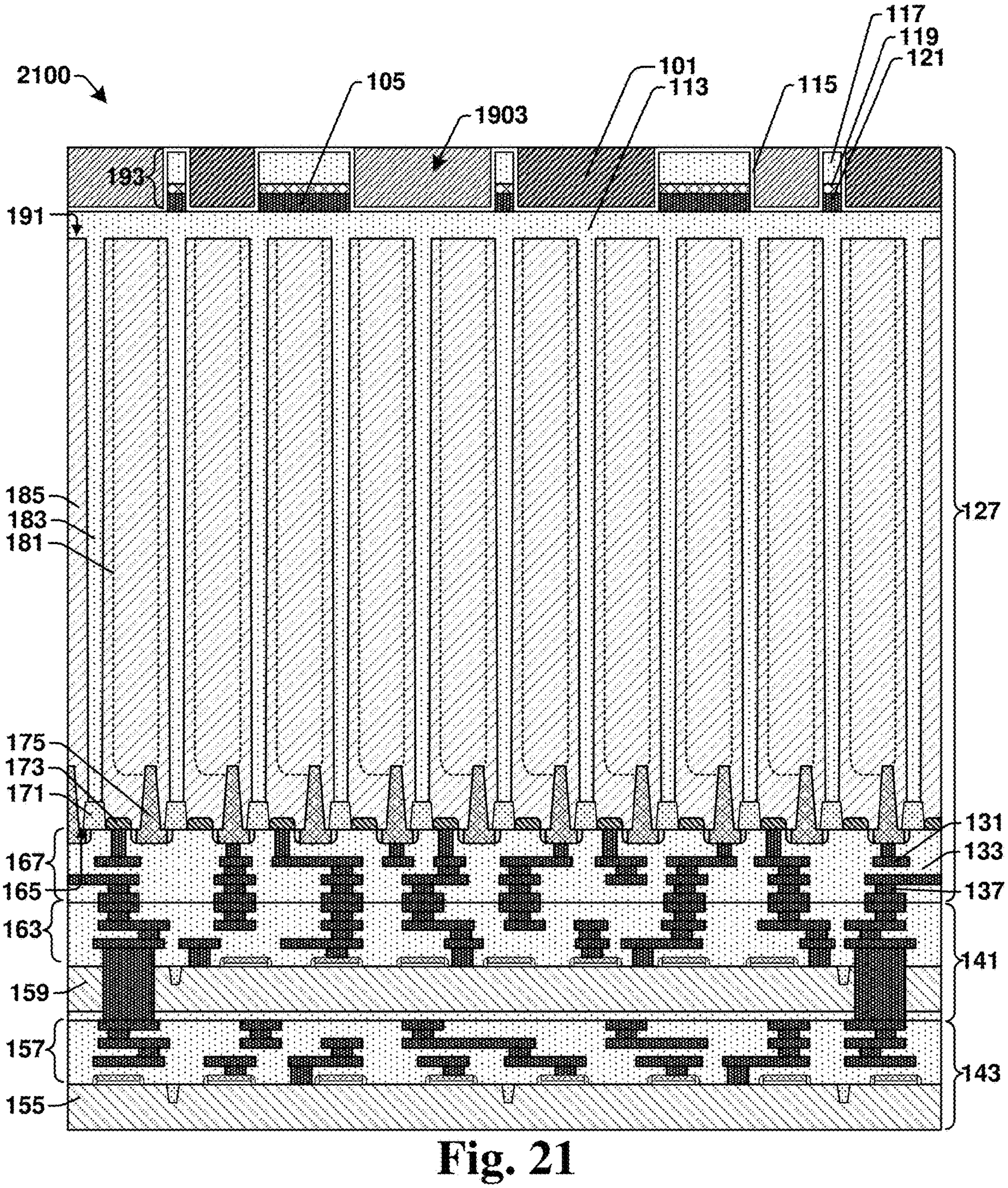

As shown by the cross-sectional view 2100 of FIG. 21, color filters 101 may be formed in the openings 1903 of the composite grid 193. The color filters 101 may include red, green, and blue color filters. Other color combinations, such as cyan, yellow, and magenta, may be used instead. The color filters 101 may be in a Bayer pattern or some other pattern. The color filters 101 may include any suitable number of colors and may be in any suitable pattern.

The color filters 101 may comprise a polymer formed from a polymer resin containing a pigment or dye. The polymer may be, for example, polymethyl-methacrylate (PMMA), poly (glycidyl methacrylate) (PGMS), or the like. In some embodiments, a polymer with a first color, e.g., red, is formed in the openings 1903 using a process such as spin coating or the like. The polymer of the first color is then removed from some of the openings 1903 using photolithographic masking and etching. A polymer with a second color, e.g., blue, is applied next by a similar process and fills the etched out openings 1903. Another masking and etching process is carried out followed by application of the third color, e.g., green. After formation of the color filters 101, a planarization process may be carried out to remove excess material. The planarization process may be CMP or the like. If the composite grid 193 includes a hard mask, the hard mask may be removed by this CMP process.

Microlenses 109 may be formed over the color filters 101. The resulting structure may correspond the image sensor 100 as shown in FIG. 1. The microlenses 109 may be any suitable material. For example, the microlenses 109 may a high transmittance, acrylic polymer or the like. The microlenses 109 may be formed by depositing and then shaping a microlens layer. In some embodiments, a microlens layer is applied in a liquid state by spin coating or the like. Spin coating can produce a highly uniform microlens layer. Alternatively, the microlens layer may be formed by a deposition technique such as CVD, PVD, the like, or some other suitable process. The microlens layer may be patterned using photolithography. After patterning, the microlens layer may be reflowed to form the curved surfaces of the microlenses 109. After reflowing, the microlens layer may be cured. Curing may be accomplished by UV treatment, the like, or in some other suitable way.

Figure 22:
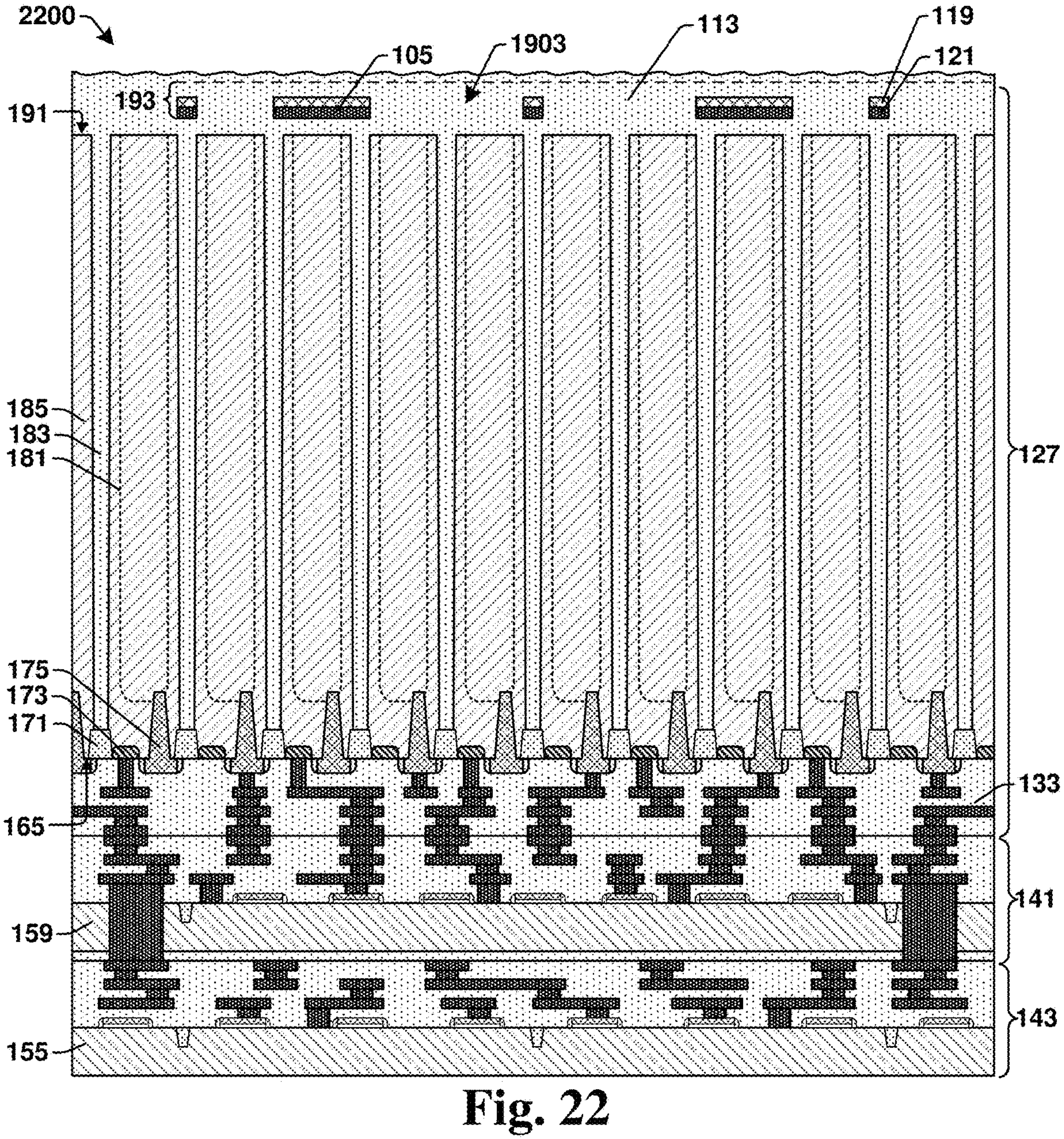
FIGS. 22-24 illustrates a variation on the method of FIGS. 6-21 in accordance with some other embodiments.
Figure 23:
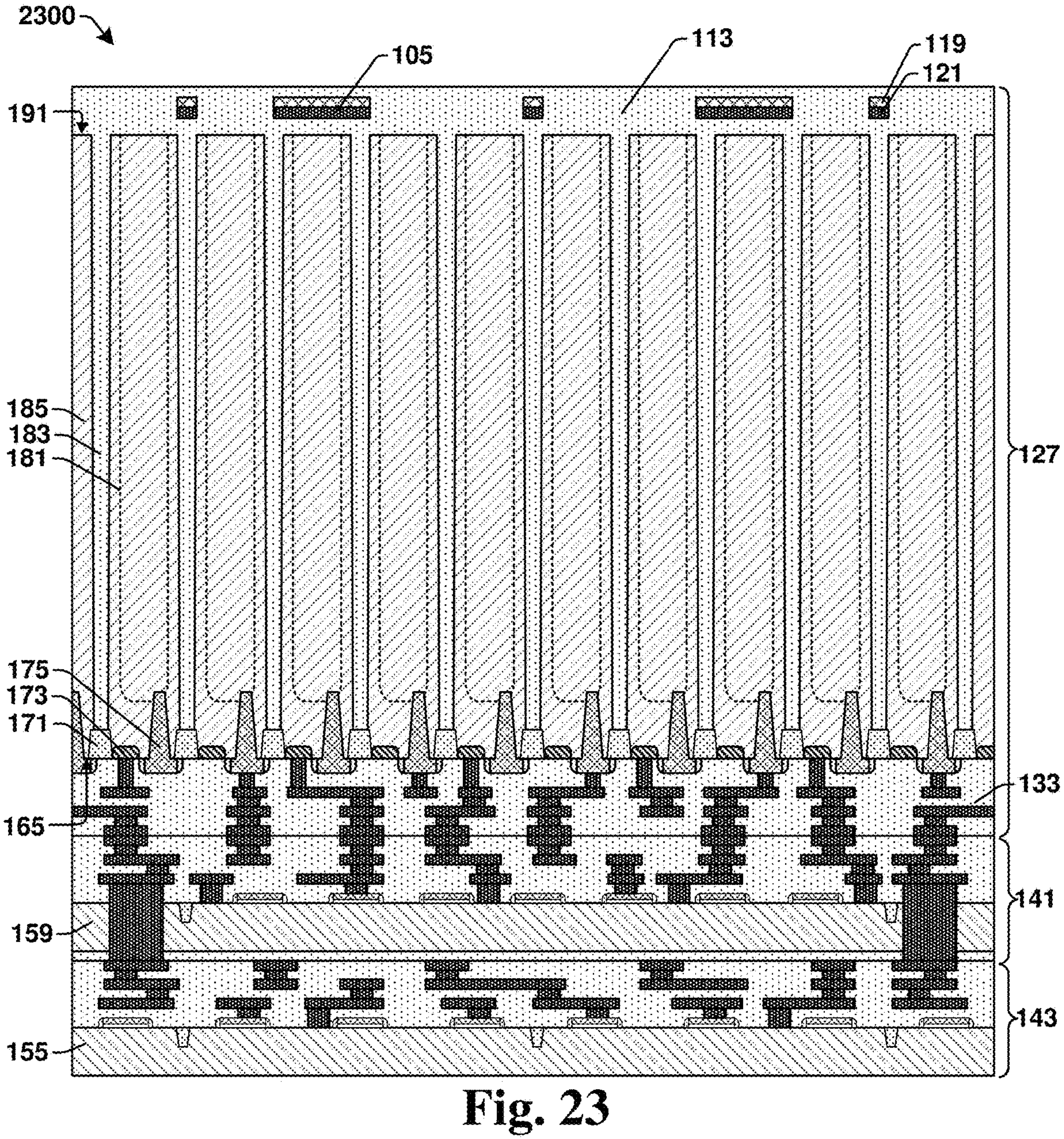
Figure 24:
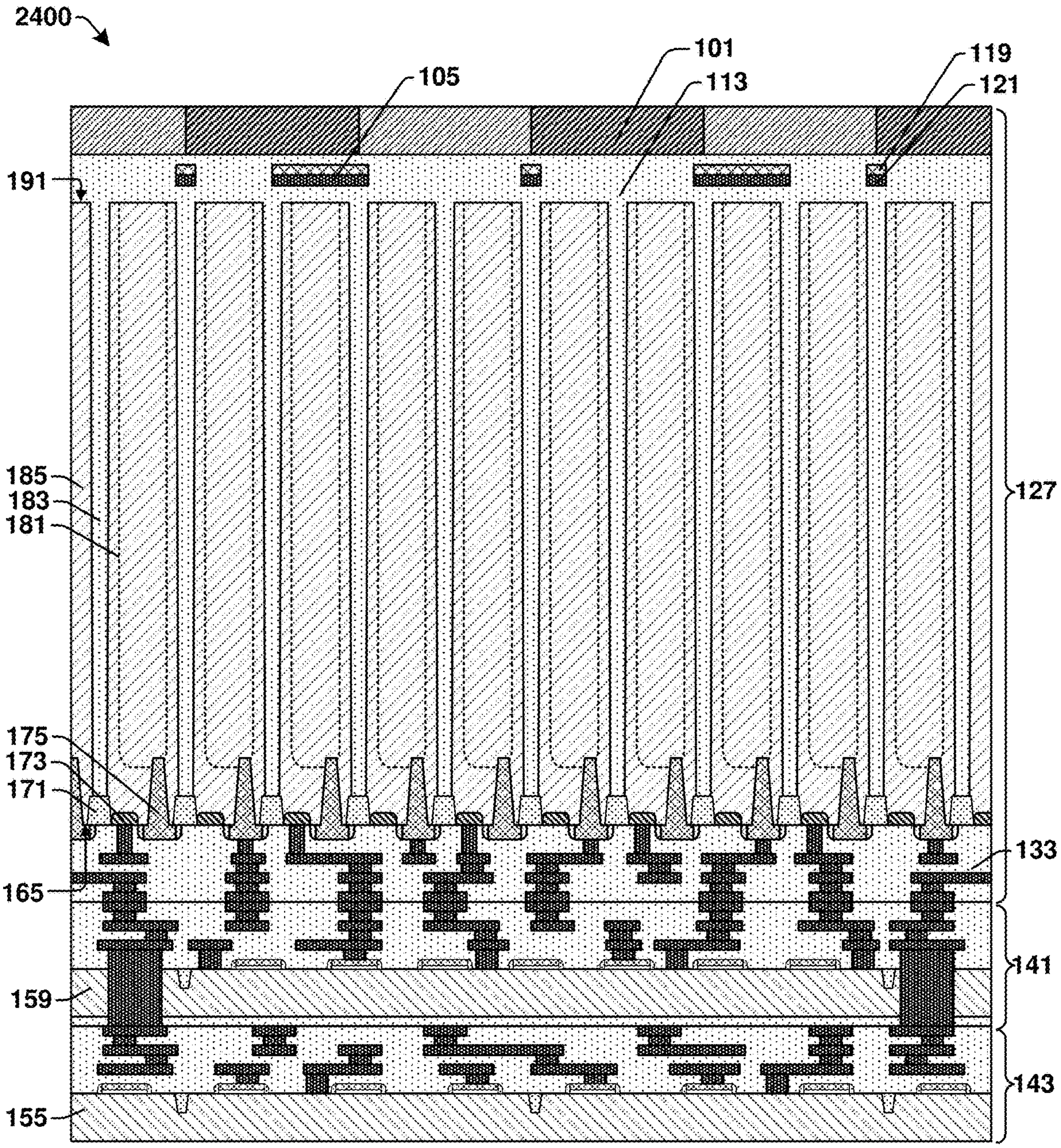

FIGS. 22-24 provide a series of cross-sectional views 2200-2400 that illustrate a variation on the foregoing process. This variation may be used to produce the image sensor 500 of FIG. 5 or the like. The variation begins after patterning the composite grid 193 as shown by the cross-sectional view 1900 of FIG. 19.

As shown by the cross-sectional view 2200 of FIG. 22 instead of filling the openings 1903 in the composite grid with the color filters 101 (compare FIG. 21), the opening 1903 are filled with additional dielectric 113. The additional dielectric 113 may be deposited by PVD, CVD, the like, or any other suitable process. The additional dielectric 113 may be the same as or different from the underlying dielectric 113. In some embodiments, the additional dielectric 113 is or comprises silicon dioxide or the like.

The term "composite grid" is typically applied to multiple layers of material that form a grid around the color filters 101 (see FIG. 21). In the present disclosure, the term "composite grid" is applied because the metal layer 121 has a grid structure and the antireflective coating 119 has the same grid structure and is patterned under the same mask 1901 (see FIG. 19) as the metal layer 121. Patterning the antireflective coating 119 under the same mask 1901 as the metal layer 121 limits the antireflective coating 119 to the same footprint, whereby the antireflective coating 119 does not extend into areas where it would absorb radiation in a way that could reduce quantum efficiency.

As shown by the cross-sectional view 2300 of FIG. 23, the dielectric 113 may be planarized. The planarization process may comprise CMP or the like. Planarization provides a planar surface on which to form the color filters 101 (see FIG. 24).

As shown by the cross-sectional view 2400 of FIG. 24, the color filters 101 may be formed over the structure shown by the cross-sectional view 2300 of FIG. 23. The process may be as described in connection with the cross-sectional view 2100 of FIG. 21. The microlenses 109 may the be formed to provide the image sensor 500 of FIG. 5 or the like.

Figure 25:
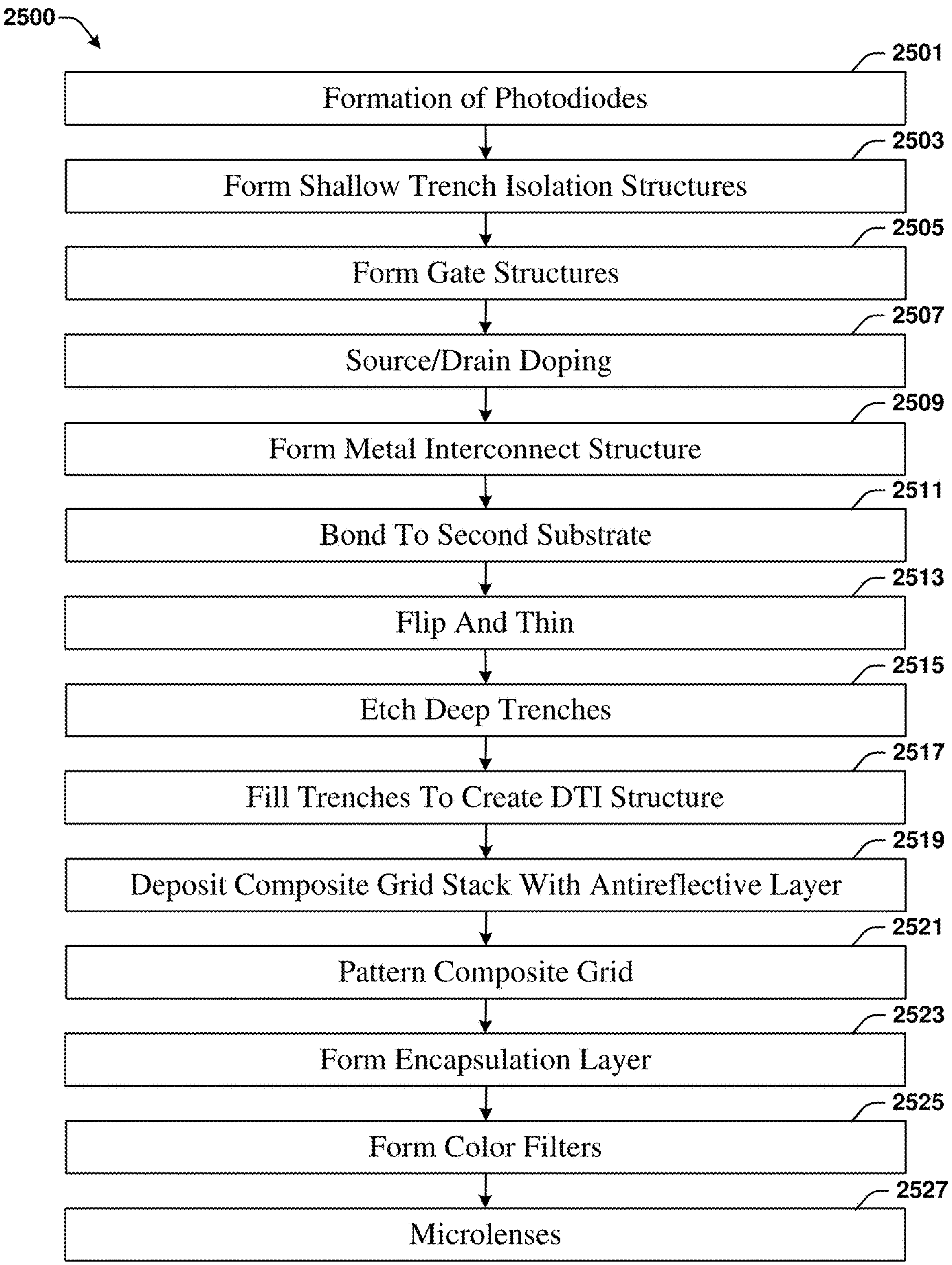
FIG. 25 is a flow chart of a process in accordance with some embodiments.

FIG. 25 provides a flow diagram for a process 2500 of forming an image sensing device according to some embodiments. While the process 2500 is illustrated and described below as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The process 2500 may begin with act 2501, implanting dopants to form photodiodes. The cross-sectional view 600 of FIG. 6 provides an example. Forming the photodiodes may include a plurality of dopant implantations some of which may be carried out later in the process 2500. Photodiode formation may begin with a deep n-well implant made using high energy dopant ions and without a mask. The process 2500 might alternatively begin with etching trenches for a front side DTI structure.

The process 2500 may continue with act 2503, forming STI structures. The cross-sectional view 700 of FIG. 7 provides an example. These STI structures may be used to land trenches for a back side DTI structure. As previously noted, the trenches for a back side DTI structure could alternatively be landed on a contact etch stop layer or on a wire in a metallization layer. Also, the trenches might simply stop short of the front side, or a front side DTI structure may be formed instead of a back side DTI structure. Accordingly, act 2503 is optional.

Act 2505 is forming gate structures on the front side. These may include transfer gates or the like. The cross-sectional views 800-1100 of FIGS. 8-11 provide an example. Act 2507 is source/drain region doping. This doping may form floating diffusion regions. The cross-sectional view 1200 of FIG. 12 provides an example.

Act 2509 is back-end-of-line (BEOL) processing, which forms a metal interconnect structure over the front side. The cross-sectional view 1300 of FIG. 13 provides an example. Act 2511 is bonding to one or more second substrates. The cross-sectional view 1400 of FIG. 14 provides an example.

Act 2513 is thinning the semiconductor body from the back side. The cross-sectional view 1500 of FIG. 15 provides an example.

Figure 17:
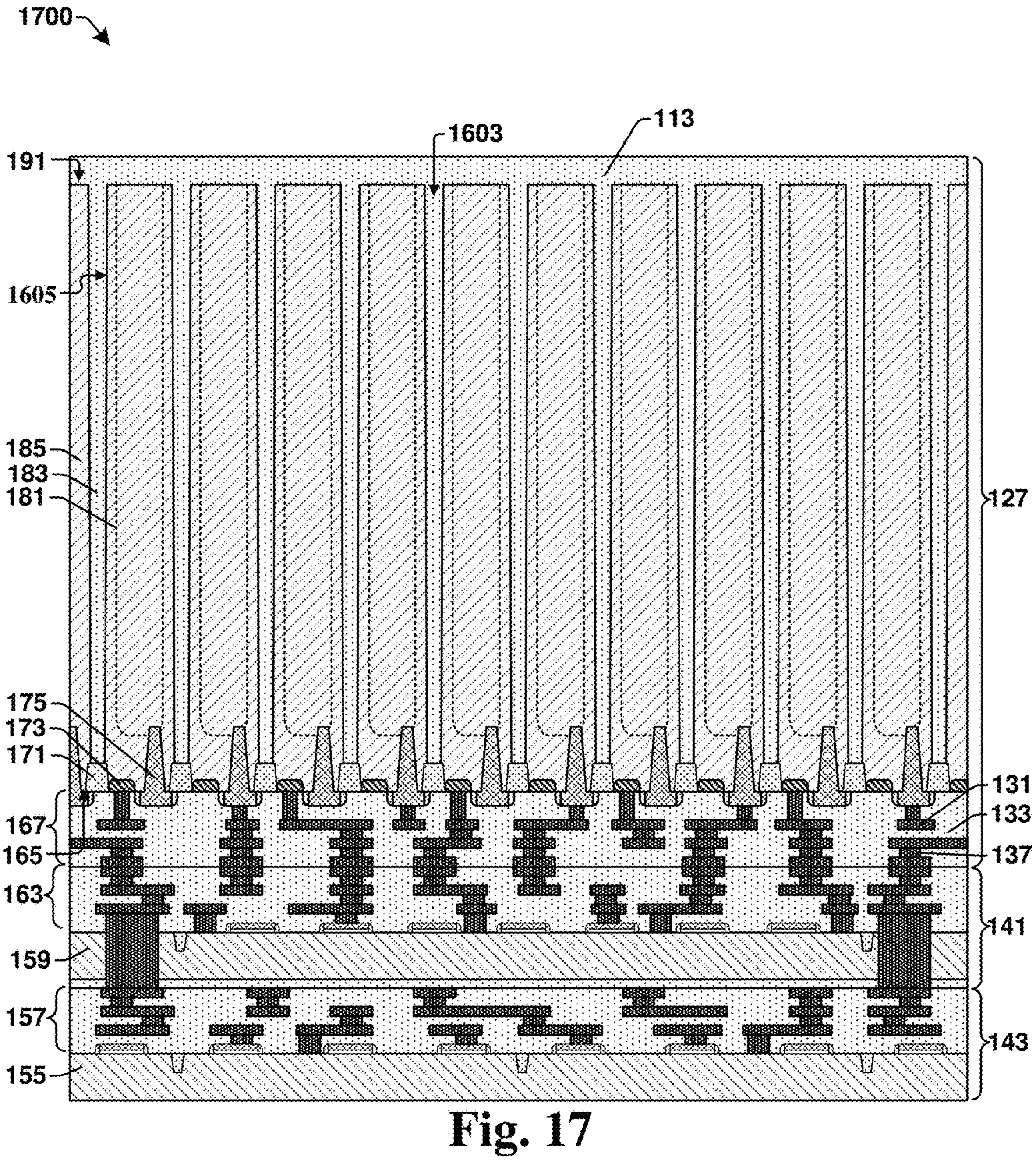

Act 2515 is etching deep trenches in the back side. The cross-sectional view 1600 of FIG. 16 provides an example. Act 2517 is filling the trenches to provide a DTI structure. The cross-sectional view 1700 of FIG. 17 provides an example. The trenches may first be lined with one or more layers of high-κ dielectric and then filled with another dielectric. The trenches may alternatively be filled with a conductive material after being lined with dielectric.

Act 2519 is forming a composite grid stack that includes an antireflective coating over a metal layer. The cross-sectional view 1800 of FIG. 18 provides an example. In some embodiments, the antireflective coating is in direct contact with the metal layer. In some embodiments, the antireflective coating comprises a quarter wavelength layer. In some embodiments, the antireflective coating comprises a plurality of quarter wavelength layers.

Act 2521 is patterning the composite grid stack. Patterning the composite grid stack forms a grid of segments that surround openings. Some of the segments are wider than others so as to provide half-shielding. The half-shielding approximately haves the widths of the affected openings. The cross-sectional view 1900 of FIG. 19 provides an example. Act 2523 is an optional step of forming an encapsulation layer over the composite grid stack. The cross-sectional view 2000 of FIG. 20 provides an example.

Act 2525 is forming color filters. In some embodiments, the color filters are formed within the openings in the composite grid so that the color filters are lateral to the back side metal grid, the half-shielding, and the layers that make up the antireflective coating. The cross-sectional view 2100 of FIG. 21 provides an example. In some embodiments, the openings in the composted grid are filled with dielectric before forming the color filters so that the color filters are above the back side metal grid, the half-shielding, and the antireflective coating. The cross-sectional views 2200-2400 of FIGS. 22-24 provide an example.

Act 2527 is forming microlenses over the color filters. The image sensors 100, 300, 400 and 500 of FIGS. 1, 3, 4, and 5 provide examples of the resulting structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:

a semiconductor substrate having a first side and a second side, the second side being different from the first side;

a metal interconnect structure comprising a plurality of metallization layers over the first side;

photodetectors comprising photosensitive areas in a first array within the semiconductor substrate;

microlenses in a second array over the second side, wherein the microlenses are positioned to focus incident radiation on corresponding photosensitive areas in the first array;

metal half-shields between a subset of the microlenses and their corresponding photosensitive areas, wherein the metal half-shields are of the type that enables half-shield phase detection autofocus;

a first antireflective layer coating the metal half-shields; and a second antireflective layer coating the first antireflective layer, wherein:

the first antireflective layer has a thickness equal to one quarter of a first visible light wavelength, the second antireflective layer has a thickness equal to one quarter of a second visible light wavelength, and the second wavelength is distinct from the first wavelength.

2. The image sensor of claim 1, wherein the first and second antireflective layers have sidewalls aligned to sidewalls of the metal half-shields.

3. The image sensor of claim 1, further comprising color filters, wherein the metal half-shields are provided by a composite grid that separates the color filters.

4. The image sensor of claim 1, further comprising color filters, wherein the metal half-shields and the first and second antireflective layers are between the color filters and the semiconductor substrate.

5. The image sensor of claim 1, wherein four of the photosensitive areas correspond with one of the microlenses.

6. The image sensor of claim 5, wherein two of the four photosensitive areas are in image sensing pixels and the other two of the four photosensitive areas are in phase detection autofocus pixels.

7. The image sensor of claim 1, wherein the first antireflective layer is in direct contact with the metal half-shields.

8. The image sensor of claim 1, wherein the first or second antireflective layer has a quarter wavelength thickness for a wavelength of green light.

9. The image sensor of claim 1, wherein the first or second antireflective layer comprises silicon oxynitride.

10. The image sensor of claim 1, wherein the first or second antireflective layer comprises a metal compound.

11. The image sensor of claim 1, wherein the first or second antireflective layer comprises a metal nitride.

12. An image sensor, comprising:

a semiconductor substrate;

an array of photodetectors comprising photosensitive areas within the semiconductor substrate;

an array of color filters over the photosensitive areas; and a composite grid comprising segments laterally separating the color filters, wherein the segments comprise a first antireflective coating and a second antireflective coating over a metal layer, wherein:

the first antireflective coating has a thickness equal to one quarter of a first visible light wavelength, the second antireflective coating has a thickness equal to one quarter of a second visible light wavelength, and the second wavelength is distinct from the first wavelength.

13. The image sensor of claim 12, further comprising an array of microlenses, wherein the array of color filters is between the microlenses and the photosensitive areas and the composite grid provides half-shielding for some of the microlenses.

14. The image sensor of claim 12, further comprising an array of microlenses, wherein the array of color filters is between the microlenses and the photosensitive areas and there are four photodetectors for each microlens.

15. A method of making an image sensor, the method comprising:

providing a semiconductor substrate comprising a first side and a second side;

forming an array of photodiodes in the semiconductor substrate;

forming a metal interconnect structure on the first side;

bonding the semiconductor substrate to a second substrate;

thinning the semiconductor substrate from the second side;

forming a stack on the second side, wherein the stack comprises a metal layer, a first antireflective coating above the metal layer, and a second antireflective coating above the first antireflective coating, wherein the first antireflective coating has a thickness equal to one quarter of a first visible light wavelength, the second antireflective coating has a thickness equal to one quarter of a second visible light wavelength, and the second wavelength is distinct from the first wavelength; and patterning the stack to form a grid having openings.

16. The method of claim 15, wherein some of the openings are smaller than the others so as to provide metal half-shields for phase detection autofocus.

17. The method of claim 15, wherein the thicknesses of the first and second antireflective coatings are direct results of deposition processes.

18. The image sensor of claim 1, wherein the first antireflective layer is in direct contact with the metal half-shields.

19. The image sensor of claim 1, wherein either the first or second antireflective layer comprises tantalum oxide.

20. The image sensor of claim 1, wherein either the first or second antireflective layer comprises a titanium nitride.

* * * * *